(12) United States Patent
Kim et al.

(10) Patent No.: US 11,404,382 B2
(45) Date of Patent: Aug. 2, 2022

(54) SEMICONDUCTOR PACKAGE INCLUDING AN EMBEDDED SEMICONDUCTOR DEVICE

(71) Applicant: SAMSUNG ELECTRONICS CO., LTD., Gyeonggi-do (KR)

(72) Inventors: Jihwang Kim, Cheonan-si (KR); Jeongmin Kang, Seoul (KR); Hyunkyu Kim, Yongin-si (KR); Jongbo Shim, Asan-si (KR); Kyoungsei Choi, Yongin-si (KR)

(73) Assignee: SAMSUNG ELECTRONICS CO., LTD., Gyeonggi-do (KR)

( * ) Notice: Subject to any disclaimer, the term of this patent is extended or adjusted under 35 U.S.C. 154(b) by 77 days.

(21) Appl. No.: 16/849,629

(22) Filed: Apr. 15, 2020

(65) Prior Publication Data
US 2021/0050297 A1 Feb. 18, 2021

(30) Foreign Application Priority Data

Aug. 12, 2019 (KR) .......................... 10-2019-0098346

(51) Int. Cl.
H01L 23/538 (2006.01)
H01L 23/498 (2006.01)
H01L 23/31 (2006.01)

(52) U.S. Cl.
CPC ...... *H01L 23/5386* (2013.01); *H01L 23/3157* (2013.01); *H01L 23/49811* (2013.01)

(58) Field of Classification Search
CPC .................................................... H01L 23/538
See application file for complete search history.

(56) References Cited

U.S. PATENT DOCUMENTS

| 8,802,999 | B2 | 6/2014 | Rye et al. |
| 9,818,784 | B2 | 11/2017 | Baba et al. |
| 9,852,976 | B2 | 12/2017 | Kelly et al. |
| 9,875,969 | B2 | 1/2018 | Braunisch et al. |
| 10,083,909 | B2 | 9/2018 | Haba |
| 10,163,798 | B1 | 12/2018 | Alur et al. |
| 10,192,816 | B2 | 1/2019 | Kelly et al. |
| 10,229,882 | B2 | 3/2019 | Deshpande et al. |
| 10,276,540 | B2 | 4/2019 | Wang et al. |

(Continued)

FOREIGN PATENT DOCUMENTS

WO WO2018/063351 4/2020

*Primary Examiner* — William A Harriston
(74) *Attorney, Agent, or Firm* — F. Chau & Associates, LLC

(57) ABSTRACT

A semiconductor package is provided including a package substrate. The package substrate includes a substrate pattern and a substrate insulation layer at least partially surrounding the substrate pattern. The package substrate has a groove. An external connection terminal is disposed below the package substrate. An embedded semiconductor device is disposed within the groove of the package substrate. The embedded semiconductor device includes a first substrate. A first active layer is disposed on the first substrate. A first chip pad is disposed on the first active layer. A buried insulation layer is disposed within the groove of the package substrate and at least partially surrounds at least a portion of a lateral surface of the embedded semiconductor device. A mounted semiconductor device is disposed on the package substrate and is connected to the package substrate and the embedded semiconductor device.

18 Claims, 17 Drawing Sheets

(56) References Cited

U.S. PATENT DOCUMENTS

| | | |
|---|---|---|
| 2004/0201089 A1 | 10/2004 | Yamaguchi |
| 2014/0248731 A1 | 9/2014 | Hosomi |
| 2016/0297671 A1 | 10/2016 | Pahl |
| 2018/0294215 A1 | 10/2018 | Kawaminami |
| 2019/0198445 A1* | 6/2019 | Alur .................. H01L 25/18 |

* cited by examiner

SEMICONDUCTOR PACKAGE INCLUDING AN EMBEDDED SEMICONDUCTOR DEVICE

CROSS-REFERENCE TO RELATED APPLICATION

This application claims priority under 35 U.S.C. § 119 to Korean Patent Application No. 10-2019-0098346, filed on Aug. 12, 2019, in the Korean Intellectual Property Office, the disclosure of which is incorporated by reference herein in its entirety.

TECHNICAL FIELD

The present inventive concept relates to semiconductor packages, and more particularly, to a semiconductor package including an embedded semiconductor device.

DISCUSSION OF THE RELATED ART

Semiconductor devices are required to have a high storage capacity, and at the same time semiconductor packages including semiconductor devices are required to be thin and light. Research into including semiconductor devices with various functions in a semiconductor package and quickly driving the semiconductor devices has been conducted. For example, research into configurations of a semiconductor package in which a second semiconductor device is mounted on a first semiconductor device has been actively conducted.

SUMMARY

According to an exemplary embodiment of the present inventive concept, a semiconductor package is provided including a package substrate. The package substrate includes a substrate pattern and a substrate insulation layer at least partially surrounding the substrate pattern. The package substrate has a groove. An external connection terminal is disposed below the package substrate. An embedded semiconductor device is disposed within the groove of the package substrate. The embedded semiconductor device includes a first substrate. A first active layer is disposed on the first substrate. A first chip pad is disposed on the first active layer. A buried insulation layer is disposed within the groove of the package substrate and at least partially surrounds at least a portion of a lateral surface of the embedded semiconductor device. A mounted semiconductor device is disposed on the package substrate and is connected to the package substrate and the embedded semiconductor device.

According to an exemplary embodiment of the present inventive concept, a semiconductor package is provided including a package substrate. The package substrate includes a substrate pattern and a substrate insulation layer at least partially surrounding the substrate pattern. The package substrate has an internal space. An external connection terminal is disposed below the package substrate. An embedded semiconductor device is disposed within the internal space of the package substrate and is at least partially surrounded by the package substrate. The embedded semiconductor device includes a first substrate, a first active layer disposed on the first substrate, and a first chip pad disposed on the first active layer. A buried insulation layer at least partially surrounds at least a portion of a lateral surface of the embedded semiconductor device. A mounted semiconductor device is disposed on the package substrate. The mounted semiconductor device is connected to the package substrate and the embedded semiconductor device. A portion of a lower surface of the mounted semiconductor device overlaps a portion of an upper surface of the embedded semiconductor device including the first active layer, in a vertical direction.

According to an exemplary embodiment of the present inventive concept, a package-on-package (PoP) type semiconductor package is provided including a lower semiconductor package. An upper semiconductor package is disposed on the lower semiconductor package. The lower semiconductor package includes a package substrate including a substrate pattern and a substrate insulation layer at least partially surrounding the substrate pattern, and having a groove exposing a portion of the substrate pattern. An external connection terminal is disposed below the package substrate. An embedded semiconductor device is disposed within the groove of the package substrate. The embedded semiconductor device includes a first substrate. A first active layer is disposed on the first substrate. A first chip pad is disposed on the first active layer, and a penetrating electrode penetrates the first substrate and connects the first active layer to the substrate pattern exposed via the groove. A mounted semiconductor device is disposed on the package substrate and connects the package substrate and the embedded semiconductor device. A conductive post is disposed on the package substrate and electrically connects to the substrate pattern. A molding material is disposed on the package substrate and at least partially surrounds the conductive post and the mounted semiconductor device and exposes a portion of the conductive post. An interposer is disposed on the molding material. The interposer includes an interposer substrate. An interposer connection terminal is disposed below the interposer substrate and in contact with the conductive post.

According to an exemplary embodiment of the present inventive concept, A semiconductor package is provided including a package substrate. The package substrate includes a substrate pattern and a substrate insulation layer at least surrounding the substrate pattern. The package substrate has a groove or internal space exposing a portion of the substrate pattern. An embedded semiconductor device is disposed in the groove or internal space of the package substrate. The embedded semiconductor device electrically connects to the substrate pattern. A molding material is disposed on the package substrate. The molding material includes a groove recessed from an outer surface of the molding material. An interposer connection terminal is disposed in the groove recessed from an outer surface of the molding material. A conductive post includes a first end disposed on the substrate pattern and a second end disposed on a lower surface of the interposer connection terminal. An upper semiconductor package is disposed on the interposer connection terminal. The upper semiconductor package is electrically connected to the substrate pattern through the interposer connection terminal and the conductive post.

BRIEF DESCRIPTION OF THE DRAWINGS

Exemplary embodiments of the present inventive concept will be more clearly understood from the following detailed description taken in conjunction with the accompanying drawings in which.

DETAILED DESCRIPTION OF THE EXEMPLARY EMBODIMENTS

Hereinafter, the present inventive concept will be described more fully with reference to the accompanying drawings, in which exemplary embodiments of the present inventive concept are shown.

Figure 1:
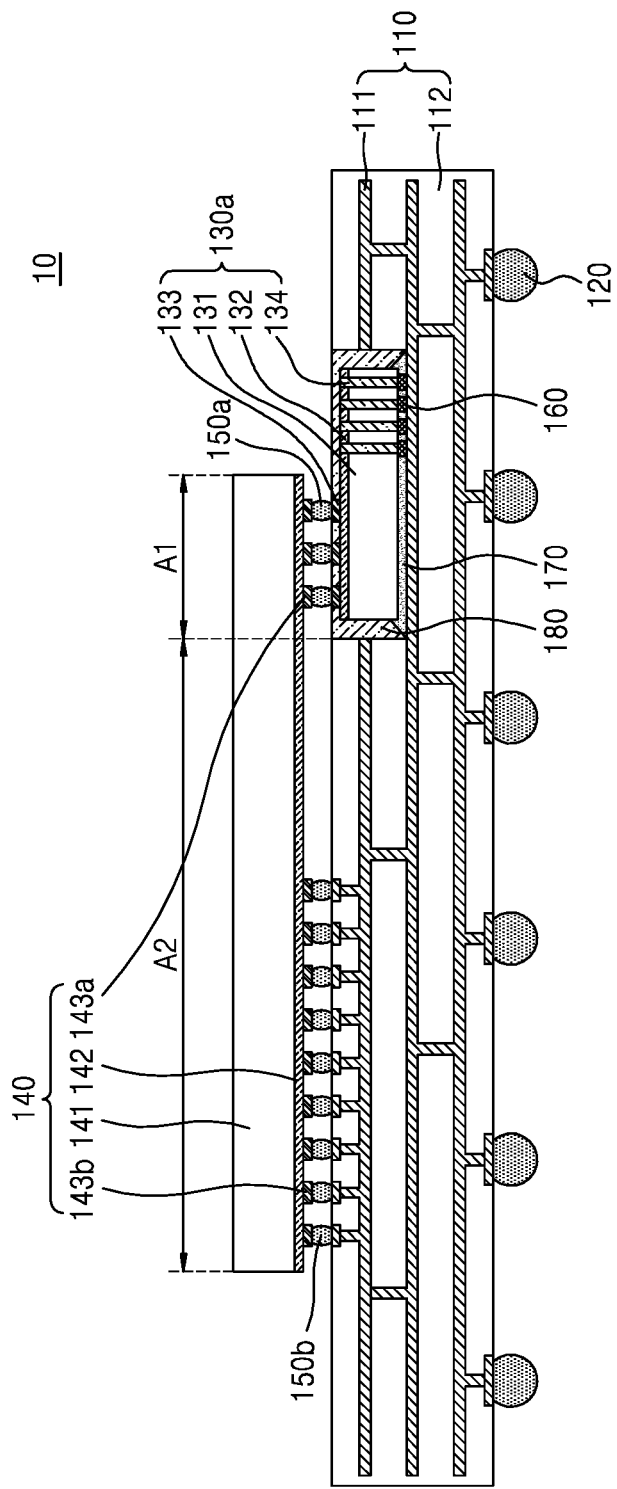
FIGS. 1 through 4 are cross-sectional views of semiconductor packages according to exemplary embodiments of the present inventive concept.

FIG. 1 is a cross-sectional view illustrating a semiconductor package 10 according to an exemplary embodiment of the present inventive concept.

Referring to FIG. 1, the semiconductor package 10 may include a package substrate 110, external connection terminals 120, a first embedded semiconductor device 130a, a mounted semiconductor device 140, first chip connection terminals 150a, second chip connection terminals 150b, internal connection terminals 160, an adhesion layer 170, and a buried insulation layer 180.

The package substrate 110 of the semiconductor package 10 may include a substrate pattern 111 and a substrate insulation layer 112 surrounding the substrate pattern 111. The package substrate 110 may include a printed circuit board (PCB). However, the package substrate 110 is not limited to a PCB and may include various types of substrates, such as a ceramic substrate.

The substrate pattern 111 may include a plurality of internal wires extending in a horizontal direction. The horizontal direction may refer to an axis parallel to an upper surface of the package substrate 110. Conductive vias may be provided that connect the internal wires to each other in a vertical direction. The vertical direction may refer to an axis perpendicular to an upper surface of the package substrate 110 (e.g., an axis normal to an upper surface of the package substrate 110). The substrate pattern 111 may include a metal from among copper (Cu), aluminum (A), nickel (Ni), tungsten (W), platinum (Pt), and/or gold (Au).

The substrate pattern 111 and associated vias thereof may be buried within the substrate insulation layer 112. The substrate insulation layer 112 may protect the substrate pattern 111 from external impacts and may prevent an electrical short-circuit of the substrate pattern 111. For example, the substrate insulation layer 112 may include an epoxy resin, polyphenylene ether, polyphenylene oxide, polyimide, and/or a liquid crystal polymer. However, the present inventive concept is not limited thereto, and the substrate insulation layer 112 may include various insulative materials.

According to an exemplary embodiment of the present inventive concept, the package substrate 110 may include a groove H1 (shown in FIG. 10) formed therein. For example, the groove H1 facing the mounted semiconductor device 140 may be formed in the package substrate 110.

The groove H1 of the package substrate 110 may provide a space into which the first embedded semiconductor device 130a is inserted. The groove H1 of the package substrate 110 may have a greater volume than the first embedded semiconductor device 130a. However, the present inventive concept is not limited thereto. For example, the groove H1 of the package substrate 110 may be formed in the package substrate 110 to have a shape substantially identical to a shape of the first embedded semiconductor device 130a. Although the groove H1 is shown as recessed from an upper surface of the package substrate 110, the present inventive concept is not limited thereto. For example, the groove H1 may be disposed in recessed lateral surfaces of the package substrate 110.

A portion of the substrate pattern 111 may be exposed via the groove H1 of the package substrate 110. For example, parallel side surfaces of the groove H1 may be disposed on respective end surfaces of a first horizontal extending substrate pattern 111, and a lower surface of the groove H1 may be disposed on an exposed upper surface of a second horizontal extending substrate pattern 111. Because the substrate pattern 111 of the package substrate 110 may be exposed by the groove H1, a first active layer 132 of the first embedded semiconductor device 130a may be electrically connected to the substrate pattern 111 via penetrating electrodes 134. A depth of the groove H1 of the package substrate 110 is greater than a thickness of the first embedded semiconductor device 130a (e.g., in the vertical direction).

The external connection terminals 120 of the semiconductor package 10 may be terminals that electrically connect the first embedded semiconductor device 130a and the mounted semiconductor device 140 to an external apparatus. The external connection terminals 120 may be electrically connected to the substrate pattern 111 of the package substrate 110. For example, the external connection terminals 120 may include conductive balls and/or solder balls. However, the present inventive concept is not limited thereto, and the external connection terminals 120 may include at least one of conductive bumps, conductive spacers, and a pin grid array.

The first embedded semiconductor device 130a of the semiconductor package 10 may be inserted into the groove H1 of the package substrate 110. For example, the first embedded semiconductor device 130a may be inserted into the groove H1 of the package substrate 110 and connected to the substrate pattern 111. The first embedded semiconductor device 130a may be inserted into the groove H1 of the package substrate 110 such that the first active layer 132 faces the mounted semiconductor device 140.

The first embedded semiconductor device 130a may include a memory semiconductor device. The memory semiconductor device may include, for example, a volatile memory semiconductor device, such as Dynamic Random Access Memory (DRAM) or Static Random Access Memory (SRAM), and may include a non-volatile memory semiconductor device, such as Phase-change Random Access Memory (PRAM), Magnetoresistive Random Access Memory (MRAM), Ferroelectric Random Access Memory (FeRAM), or Resistive Random Access Memory (RRAM). However, the present inventive concept is not limited thereto, and the first embedded semiconductor device 130a may include various other types of semiconductor devices.

The first embedded semiconductor device 130a may include a first substrate 131, the first active layer 132, first chip pads 133, and the penetrating electrodes 134. The first substrate 131 may include a silicon wafer.

The first active layer 132 may be formed on the first substrate 131 (e.g., an upper surface thereof). The first active layer 132 may include a plurality of individual devices of various types. The plurality of individual devices may include various microelectronic devices, for example, a metal-oxide-semiconductor field effect transistor (MOSFET) (e.g., a complementary metal-oxide-semiconductor (CMOS) transistor), a system large scale integration (LSI) device, an image sensor (e.g., a CMOS imaging sensor (CIS)), and a micro-electro-mechanical system (MEMS). A protection layer may be formed on the first active layer 132 (e.g., an upper surface thereof). The protection layer may cover a surface of the first active layer 132 and may expose the first chip pads 133.

The first chip pads 133 may be on the first active layer 132. The first chip pads 133 may be electrically connected to the first active layer 132. The first chip pads 133 may electrically connect the first embedded semiconductor device 130a to the mounted semiconductor device 140. As shown in FIG. 1, the first chip pads 133 may be overlapped by second chip pads 143a of the mounted semiconductor device 140 in the vertical direction. The first chip pads 133 may have upper surfaces that are substantially coplanar with an upper surface of the package substrate 110.

The penetrating electrodes 134 may penetrate through upper and lower surfaces of the first substrate 131 and may be electrically connected to the first active layer 132. For example, the penetrating electrodes 134 may extend through the inside of the first active layer 132 with lateral surfaces in contact therewith, and the penetrating electrodes 134 may contact an internal connection terminal 160 at a first end and a buried insulation layer 180 at a second end spaced apart in the vertical direction. Thus the penetrating electrodes 134 may be electrically connected to the plurality of individual devices of the first active layer 132.

The penetrating electrodes 134 may have a pillar shape. Each of the penetrating electrodes 134 may include a barrier layer formed on at least one surface of a pillar, and a buried conductive layer filling the inside of the barrier layer. The buried conductive layer may include a conductive material, for example, a metal such as copper (Cu), aluminum (Al), nickel (Ni), tungsten (W), platinum (Pt), and/or gold (Au). The buried conductive layer may extend to the inside of the first active layer 132.

According to an exemplary embodiment of the present inventive concept, as shown in FIG. 1, the first embedded semiconductor device 130a may include the first chip pads 133 in a first area and may include the penetrating electrodes 134 in a second area spaced apart from the first area (e.g., in the horizontal direction). The first embedded semiconductor device 130a may be inserted into the groove H1 of the package substrate 110 such that the first chip pads 133 are closer to a center portion of the package substrate 110 than the penetrating electrodes 134. For example, the first chip pads 133 may overlap an edge portion of the mounted semiconductor device 140 and the penetrating electrodes 134 might not overlap the mounted semiconductor device 140.

The internal connection terminals 160 of the semiconductor package 10 may be interposed between the first embedded semiconductor device 130a and the package substrate 110 and accordingly, may connect the first embedded semiconductor device 130a to the package substrate 110. For example, the internal connection terminals 160 may be interposed between the first embedded semiconductor device 130a and a lower surface of the groove H1 of the package substrate 110. The internal connection terminals 160 may include conductive balls and/or solder balls formed below the penetrating electrodes 134, and the internal connection terminals 160 may electrically connect the penetrating electrodes 134 to the substrate pattern 111.

The adhesion layer 170 of the semiconductor package 10 may be interposed between the bottom surface of the groove H1 of the package substrate 110 and the first embedded semiconductor device 130a and may be configured to firmly attach the first embedded semiconductor device 130a to the groove H1 of the package substrate 110. The adhesion layer 170 may be a non-conductive film (NCF), for example, a film formed of an insulative polymer. The adhesion layer 170 may surround exposed surfaces of the internal connection terminals 160 and may be located between the package substrate 110 and the first embedded semiconductor device 130a.

The buried insulation layer 180 of the semiconductor package 10 may fill a space between an inner sidewall of the groove H1 of the package substrate 110 and a lateral surface of the first embedded semiconductor device 130a. The buried insulation layer 180 may surround the lateral surface of the first embedded semiconductor device 130a and may cover an upper surface thereof. However, the buried insulation layer 180 may expose the first chip pads 133 of the first embedded semiconductor device 130a by not covering the first chip pads 133. The buried insulation layer 180 may be configured to firmly attach the first embedded semiconductor device 130a to the groove H1 of the package substrate 110. The buried insulation layer 180 may be substantially coplanar with an upper surface of the package substrate 110.

The buried insulation layer 180 may include an insulative material. For example, the buried insulation layer 180 may include an epoxy resin, polybenzobisoxazole (PBO), benzocyclobutene (BCB), polymide, and/or a polymide derivative.

The mounted semiconductor device 140 may be mounted on the package substrate 110. The mounted semiconductor device 140 may be connected to the package substrate 110 and the first embedded semiconductor device 130a.

According to an exemplary embodiment of the present inventive concept, the mounted semiconductor device 140 may include a logic semiconductor device, for example, a Central Processor Unit (CPU), a Micro Processor Unit (MPU), a Graphics Processor Unit (GPU), or an Application Processor (AP). However, the present inventive concept is not limited thereto, and the mounted semiconductor device 140 may include various other types of semiconductor devices.

The mounted semiconductor device 140 may include a second substrate 141, a second active layer 142, the second chip pads 143a, and third chip pads 143b. The orientation of the second substrate 141, the second active layer 142, the second chip pads 143a, and the third chip pads 143b of the mounted semiconductor device 140 may be similar to the description of the first embedded semiconductor device 130a and associated elements discussed above, and thus a detailed description thereof will be omitted for brevity.

According to an exemplary embodiment of the present inventive concept, the mounted semiconductor device 140 may be mounted on the package substrate 110 such that the second active layer 142 faces the package substrate 110. Accordingly, the second active layer 142 of the mounted semiconductor device 140 may face the first active layer 132 of the first embedded semiconductor device 130a. For example, the second active layer 142 may at least partially overlap the first active layer 132.

A portion of a lower surface of the mounted semiconductor device 140 may overlap a portion of the upper surface of the first embedded semiconductor device 130a including the first active layer 132, in the vertical direction.

The mounted semiconductor device 140 may include a first area A1 and a second area A2. The first area A1 may be an area of the mounted semiconductor device 140 that is connected to the first embedded semiconductor device 130a, and the second area A2 may be an area of the mounted semiconductor device 140 that is connected to the package substrate 110. The first area A1 may be an area of the mounted semiconductor device 140 that overlaps the groove H1 of the package substrate 110 in the vertical direction, and the second area A2 may be an area of the mounted semiconductor device 140 that does not overlap the groove H1 of the package substrate 110 in the vertical direction. For example, the second area A2 may represent the difference between the total width of the semiconductor device 140 and the first area A1. The first area A1 may be smaller than the second area A2.

The second chip pads 143a of the mounted semiconductor device 140 may be in the first area A1 and may be electrically connected to the first chip pads 133 of the first embedded semiconductor device 130a. The third chip pads 143b of the mounted semiconductor device 140 may be in the second area A2 and may be electrically connected to the substrate pattern 111 of the package substrate 110. For example, the mounted semiconductor device 140 may be connected to the first embedded semiconductor device 130a via the second chip pads 143a. The mounted semiconductor device 140 may be connected to the package substrate 110 via the third chip pads 143b.

According to an exemplary embodiment of the present inventive concept, a width of a portion of the second substrate 141 having the second chip pads 143a overlapping the groove H1 of the package substrate 110 in the vertical direction may be less than a width of a portion of the second substrate 141 having the third chip pads 143b not overlapping the groove H1 of the package substrate 110 in the vertical direction.

The first chip connection terminals 150a of the semiconductor package 10 may be interposed between the second chip pads 143a of the mounted semiconductor device 140 and the first chip pads 133 of the first embedded semiconductor device 130a. The first chip connection terminals 150a may electrically connect the first chip pads 133 to the second chip pads 143a. According to an exemplary embodiment of the present inventive concept, the first chip connection terminals 150a may overlap the groove H1 of the package substrate 110 in the vertical direction.

The second chip connection terminals 150b may be interposed between the third chip pads 143b of the mounted semiconductor device 140 and the package substrate 110. The second chip connection terminals 150b may electrically connect the substrate pattern 111 to the third chip pads 143b. According to an exemplary embodiment of the present inventive concept, the second chip connection terminals 150b may not overlap the groove H1 of the package substrate 110 in the vertical direction.

Because the first embedded semiconductor device 130a and the mounted semiconductor device 140 of the semiconductor package 10 may be electrically connected to each other and may have a short electrical connection path, the first embedded semiconductor device 130a and the mounted semiconductor device 140 may provide increased driving performance.

Because the semiconductor package 10 may include the first embedded semiconductor device 130a inserted into the groove H1 of the package substrate 110, the semiconductor package 10 may be thin and light.

Figure 2:
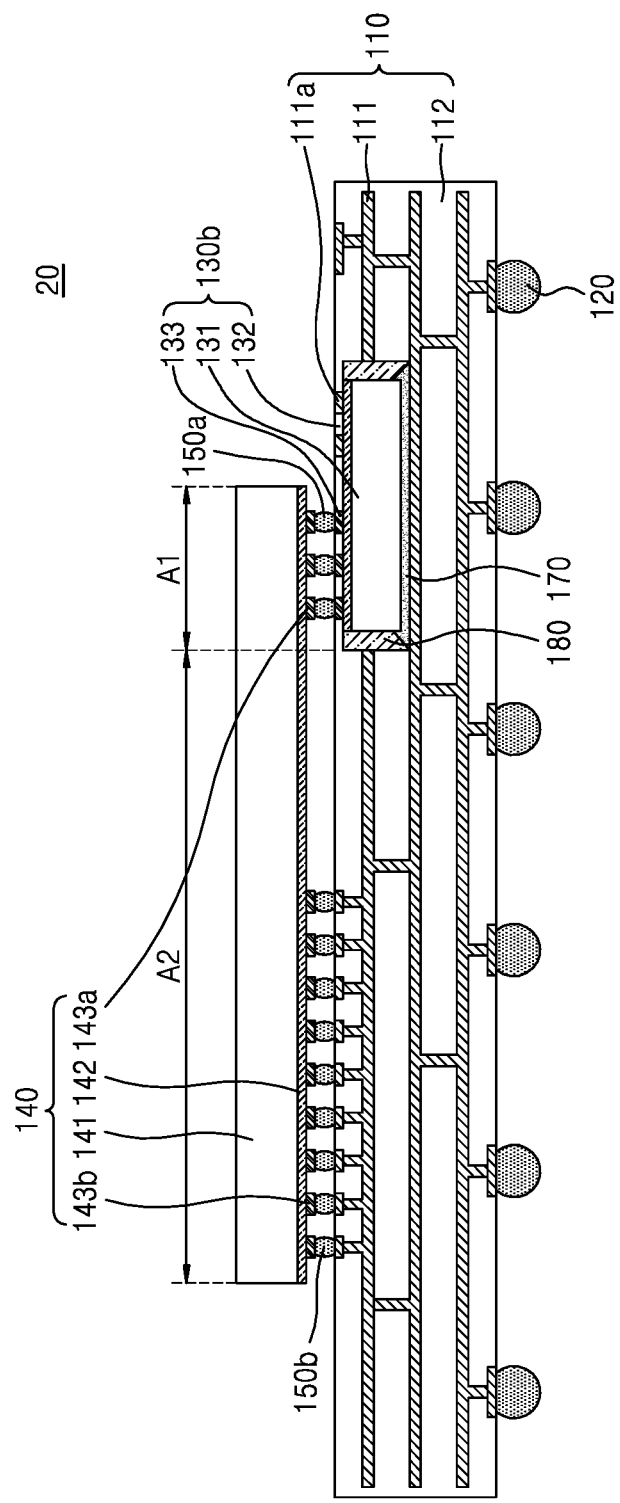

FIG. 2 is a cross-sectional view of a semiconductor package 20 according to an exemplary embodiment of the present inventive concept.

Referring to FIG. 2, the semiconductor package 20 may include a package substrate 110, external connection terminals 120, a second embedded semiconductor device 130b, a mounted semiconductor device 140, first chip connection terminals 150a, second chip connection terminals 150b, an adhesion layer 170, and a buried insulation layer 180. The package substrate 110, the external connection terminal 120, the mounted semiconductor device 140, the first chip connection terminals 150a, the second chip connection terminals 150b, the adhesion layer 170, and the buried insulation layer 180 may by similar to the description provided above in reference to FIG. 1, and thus a detailed description thereof will be omitted for brevity.

Referring to FIG. 2, the package substrate 110 may include an internal space. The internal space may be buried within the package substrate 110. For example, the package substrate 110 may entirely surround the internal space, including an upper surface thereof. Accordingly, when the package substrate 110 is viewed from the outside, the internal space might not be exposed to the outside.

As described above, the package substrate 110 may include a substrate pattern 111. Referring to FIG. 1, a portion of the substrate pattern 111 that covers an upper portion of the internal space may be defined as upper substrate patterns 111a. For example, the upper substrate patterns 111a may be a portion of the substrate pattern 111 that is on a higher level than the internal space. The upper substrate patterns 111a may be spaced apart from the first chip pads 133 (e.g., in the horizontal direction).

According to an exemplary embodiment of the present inventive concept, when the upper substrate patterns 111a are viewed from top to bottom, each of the upper substrate patterns 111a may have a width of about 1 micrometer to about 7 micrometers. For example, each of the upper substrate patterns 111a may have a width of about 1 micrometer to about 5 micrometers. A distance between the upper substrate patterns 111a may be about 1 micrometer to about 7 micrometers. For example, the distance between the upper substrate patterns 111a may be about 1 micrometer to about 5 micrometers.

The second embedded semiconductor device 130b of the semiconductor package 20 may be within the internal space of the package substrate 110. For example, the second embedded semiconductor device 130b may be within the internal space of the package substrate 110 such that the first active layer 132 faces the mounted semiconductor device 140. The first active layer 132 of the second embedded semiconductor device 130b may be electrically connected to the upper substrate patterns 111a on the internal space. Accordingly, the second embedded semiconductor device 130b may be connected to the external connection terminals 120.

The second embedded semiconductor device 130b may include the first substrate 131, the first active layer 132, and the first chip pads 133. In contrast with the first embedded semiconductor device 130a of FIG. 1, the second embedded semiconductor device 130b may include no penetrating electrodes. The first substrate 131, the first active layer 132, and the first chip pads 133 of the second embedded semiconductor device 130b may be similar to the descriptions provided above with reference to FIG. 1, and thus a detailed description thereof will be omitted for brevity.

The adhesion layer 170 of the semiconductor package 20 may be interposed between the package substrate 110 and the second embedded semiconductor device 130b and may be configured to firmly attach the second embedded semiconductor device 130b to the internal space of the package substrate 110. The adhesion layer 170 may be an NCF, for example, a film formed of an insulative polymer.

The buried insulation layer 180 of the semiconductor package 20 may fill a space between an inner sidewall of the package substrate 110 and a lateral surface of the second embedded semiconductor device 130b. The buried insulation layer 180 may include an insulative material. For example, the buried insulation layer 180 may include an epoxy resin, polybenzobisoxazole, benzocyclobutene, polyimide, and/or a polyimide derivative.

According to an exemplary embodiment of the present inventive concept, the package substrate 110 may cover an upper portion of the second embedded semiconductor device 130b. The upper portion of the second embedded semiconductor device 130b may be a portion of the second embedded semiconductor device 130b in which the first active layer 132 is formed. For example, the substrate insulation layer 112 of the package substrate 110 may cover the upper portion of the second embedded semiconductor device 130b, but may still expose the first chip pads 133 of the second embedded semiconductor device 130b. The first chip pads 133 of the second embedded semiconductor device 130b may be electrically connected to the second chip pads 143a of the mounted semiconductor device 140 to be described later.

The package substrate 110 may include the upper substrate patterns 111a on the upper portion of the second embedded semiconductor device 130b. The upper substrate patterns 111a may be electrically connected to the substrate pattern 111, which is on a level lower than the upper substrate patterns 111a, via conductive vias and may be finally electrically connected to the external connection terminals 120. For example, the first active layer 132 of the second embedded semiconductor device 130b may be electrically connected to the external connection terminals 120 via the upper substrate patterns 111a.

The mounted semiconductor device 140 may include a second substrate 141, a second active layer 142, second chip pads 143a, and third chip pads 143b. The mounted semiconductor device 140 may be mounted on the package substrate 110 such that the second active layer 142 faces the package substrate 110. Accordingly, the second active layer 142 of the mounted semiconductor device 140 may face the first active layer 132 of the second embedded semiconductor device 130b.

For example, an edge portion of the lower surface of the mounted semiconductor device 140 may overlap an edge portion of the upper surface of the second embedded semiconductor device 130b including the first active layer 132, in the vertical direction.

The mounted semiconductor device 140 may include a first area A1 and a second area A2. The first area A1 may be an area of the mounted semiconductor device 140 that is connected to the second embedded semiconductor device 130b, and the second area A2 may be an area of the mounted semiconductor device 140 that is connected to the package substrate 110. The first area A1 may be an area of the mounted semiconductor device 140 that overlaps the internal space of the package substrate 110 in the vertical direction, and the second area A2 may be an area of the mounted semiconductor device 140 that does not overlap the internal space of the package substrate 110 in the vertical direction. For example, the second area A2 may represent the difference between the total width of the semiconductor device 140 and the first area A1. The first area A1 may be smaller than the second area A2.

The second chip pads 143a of the mounted semiconductor device 140 may be in the first area A1 and may be electrically connected to the first chip pads 133 of the second embedded semiconductor device 130b. The third chip pads 143b of the mounted semiconductor device 140 may be in the second area A2 and may be electrically connected to the substrate pattern 111 of the package substrate 110. For example, the mounted semiconductor device 140 may be connected to the second embedded semiconductor device 130b via the second chip pads 143a. The mounted semiconductor device 140 may be connected to the package substrate 110 via the third chip pads 143b.

According to an exemplary embodiment of the present inventive concept, a width of a portion of the second substrate 141 having the second chip pads 143a overlapping the internal space of the package substrate 110 in the vertical direction may be less than that of a portion of the second substrate 141 having the third chip pads 143b not overlapping the internal space of the package substrate 110 in the vertical direction.

The first chip connection terminals 150a of the semiconductor package 20 may be interposed between the second chip pads 143a of the mounted semiconductor device 140 and the first chip pads 133 of the second embedded semiconductor device 130b. The first chip connection terminals 150a may electrically connect the first chip pads 133 to the second chip pads 143a. According to an exemplary embodiment of the present inventive concept, the first chip connection terminals 150a may overlap the internal space of the package substrate 110 in the vertical direction.

The second chip connection terminals 150b may be interposed between the third chip pads 143b of the mounted semiconductor device 140 and the package substrate 110. The second chip connection terminals 150b may electrically connect the substrate pattern 111 to the third chip pads 143b. According to an exemplary embodiment of the present inventive concept, the second chip connection terminals 150b might not overlap the internal space of the package substrate 110 in the vertical direction.

Because the second embedded semiconductor device 130b and the mounted semiconductor device 140 of the semiconductor package 20 may be electrically connected to each other and may have a short electrical connection path, the second embedded semiconductor device 130b and the mounted semiconductor device 140 may provide increased driving performance.

Because the semiconductor package 20 may include the second embedded semiconductor device 130b inserted into the internal space of the package substrate 110, the semiconductor package 20 may be thin and light.

Figure 3:
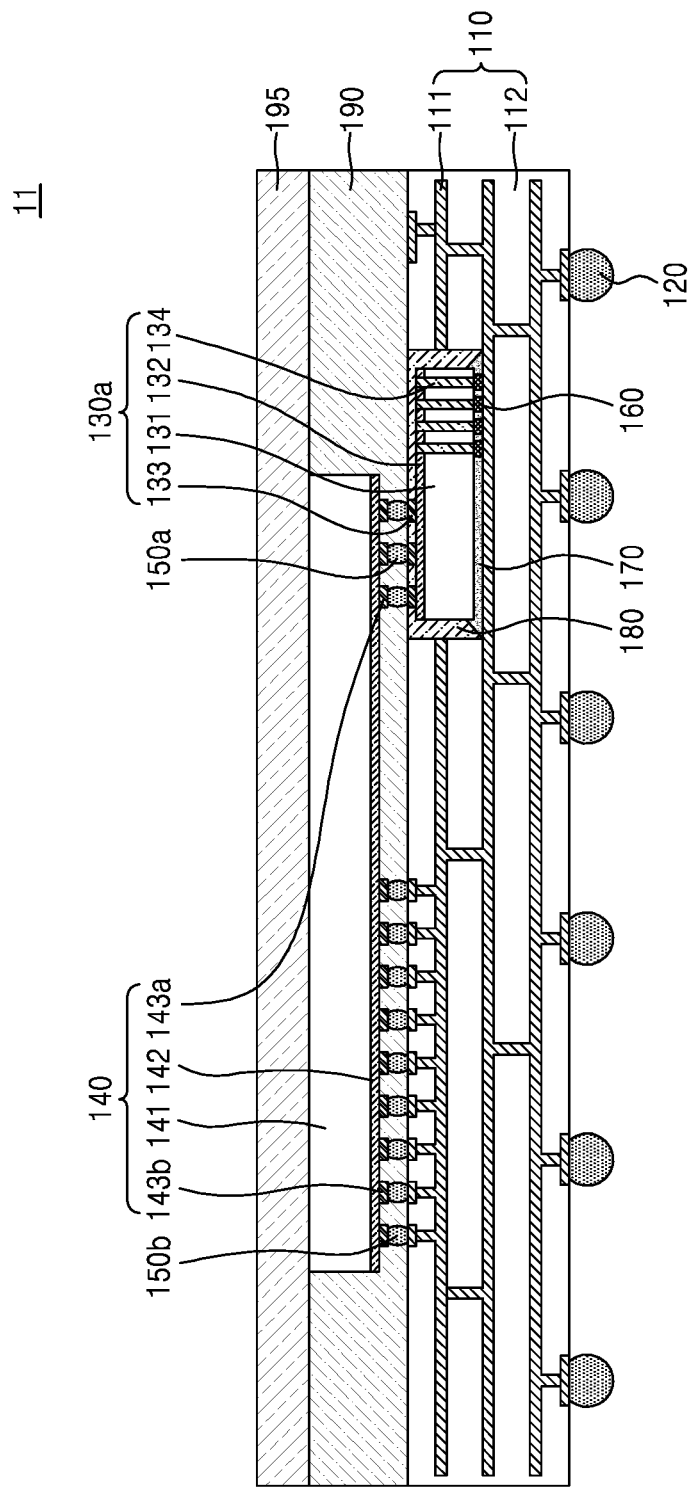

FIG. 3 is a cross-sectional view of a semiconductor package 11 according to an exemplary embodiment of the present inventive concept.

The semiconductor package 11 of FIG. 3 may include the semiconductor package 10 of FIG. 1, and may further include a molding material 190 and a heat sink 195.

According to an exemplary embodiment of the present inventive concept, the molding material 190 may be located on the package substrate 110 and at least partially surround the mounted semiconductor device 140. The molding material 190 may be configured to firmly fix the mounted semiconductor device 140 onto the package substrate 110. As shown in FIG. 3, the molding material 190 may surround at least one lateral surface of the mounted semiconductor device 140 and at least a portion of the lower surface of the semiconductor device 140, but might not cover an upper surface thereof. However, the present inventive concept is not limited thereto, and the molding material 190 may surround both the at least one lateral surface and the upper surface of the mounted semiconductor device 140.

According to an exemplary embodiment of the present inventive concept, the heat sink 195 may be mounted on the molding material 190 and/or the mounted semiconductor device 140. The heat sink 195 may be configured to emit heat generated by the mounted semiconductor device 140 and the first embedded semiconductor device 130a to the outside.

The heat sink 195 may include a metal material having high thermal conductivity. For example, the heat sink 195 may include aluminum (Al), nickel (Ni), copper (Cu), magnesium (Mg), and/or silver (Ag). The heat sink 195 may be attached onto the molding material 190 or the mounted semiconductor device 140 by an adhesive film. The adhesive film may be a film having an adhesion property, for example, a double-sided adhesive film.

Figure 4:
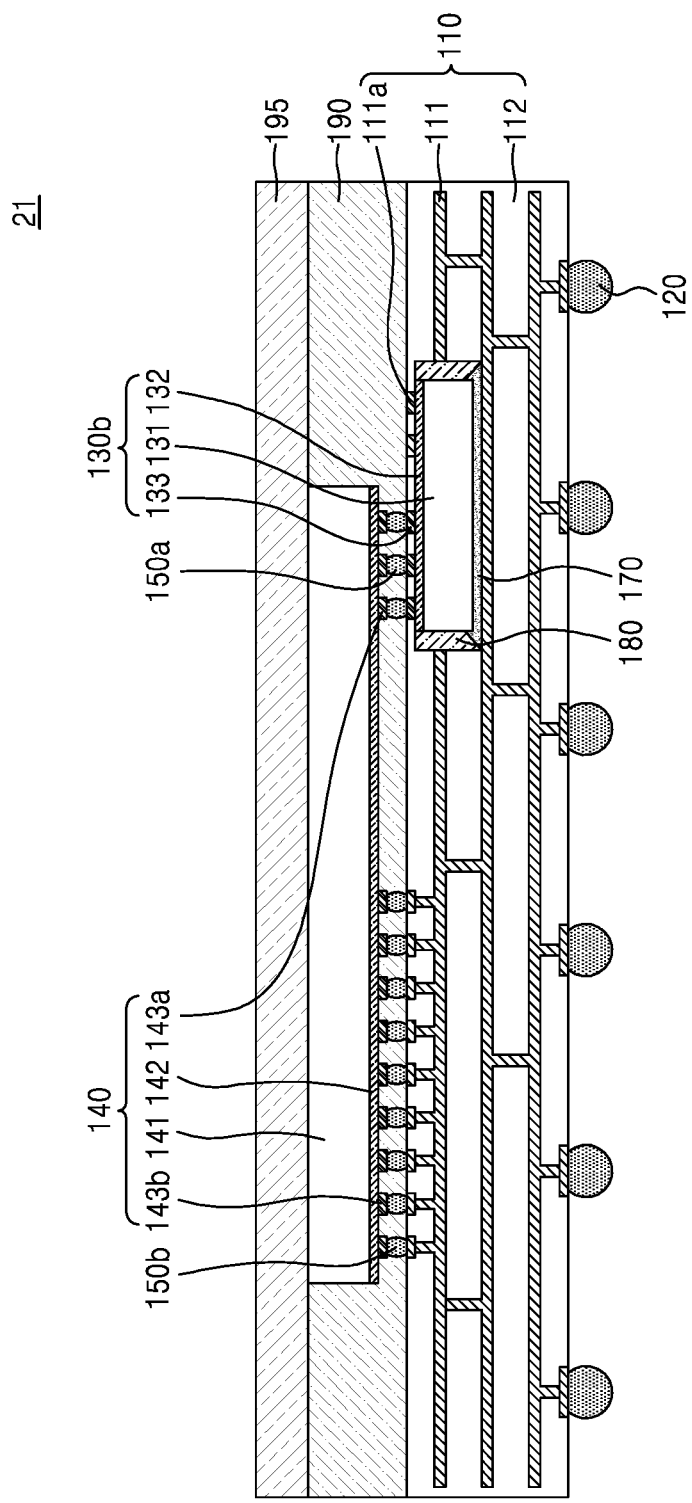

FIG. 4 is a cross-sectional view of a semiconductor package 21 according to an exemplary embodiment of the present inventive concept.

The semiconductor package 21 of FIG. 4 may include the semiconductor package 20 of FIG. 2, and may further include a molding material 190 and a heat sink 195. The molding material 190 and the heat sink 195 may be similar to the description provided above with reference to FIG. 3, and thus a detailed description thereof will be omitted for brevity.

Figure 5:
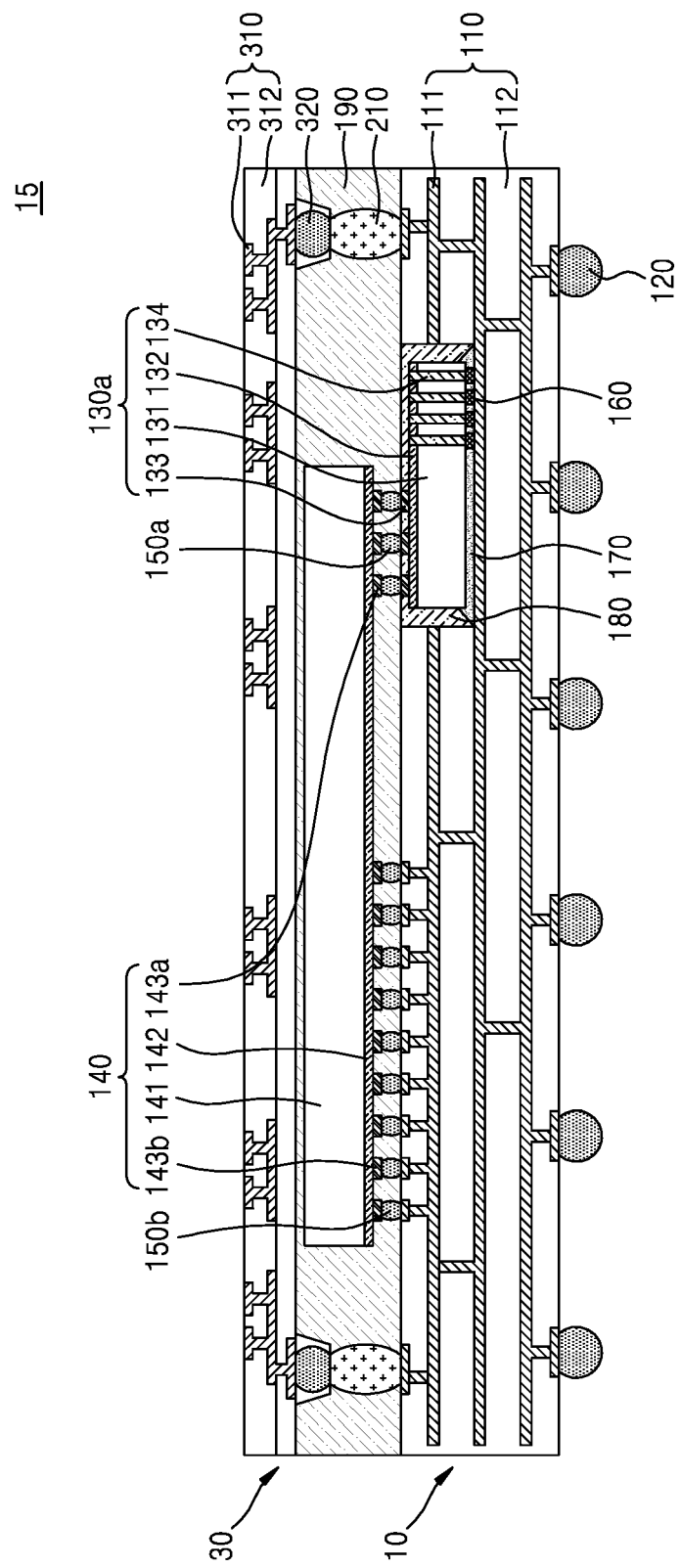
FIGS. 5 and 6 are lower semiconductor packages of package-on-package (PoP) type semiconductor packages according to exemplary embodiments of the present inventive concept.

FIG. 5 is a cross-sectional view of a semiconductor package 15 according to an exemplary embodiment of the present inventive concept. The semiconductor package 15 of FIG. 5 may be a lower semiconductor package of a package-on-package (PoP) type semiconductor package. The POP type semiconductor package includes the lower semiconductor package and an upper semiconductor package.

The semiconductor package 15 of FIG. 5 may include the semiconductor package 10 of FIG. 1, and may further include conductive posts 210, a molding material 190, and an interposer 30.

The conductive posts 210 of the semiconductor package 15 may be on the package substrate 110 (e.g., an upper surface) and may be electrically connected to the substrate pattern 111. The conductive posts 210 may electrically connect the interposer 30 to the package substrate 110. For example, upper portions of the conductive posts 210 may be connected to interposer connection terminals 320, and lower portions of the conductive posts 210 may be electrically connected to the substrate pattern 111. The conductive posts 210 may be disposed adjacent to lateral surfaces of the mounted semiconductor device 140 and may at least partially surround the mounted semiconductor device 140.

The molding material 190 may be disposed on the package substrate 110 and surround the mounted semiconductor device 140 and the conductive posts 210. The molding material 190 may include grooves H2 (shown in FIG. 14) partially exposing the upper portions of the conductive posts 210. The conductive posts 210 exposed via the grooves H2 may contact the interposer connection terminals 320. For example, the conductive post 210 may partially penetrate the molding material 190. The conductive post 210 may have an upper end lower than an upper surface of the molding material 190. A lower end of the conductive post 210 may be disposed on the substrate pattern 111 and an upper end may be disposed on a lower surface of the groove H2 which is recessed from an upper surface of the molding material 190.

The interposer 30 may include an interposer substrate 310, and the interposer connection terminals 320 formed below the interposer substrate 310.

The interposer substrate 310 may include at least one of a carrier, a PCB, and a wafer. The interposer 30 may include an interposer substrate pattern 311 and an interposer insulation layer 312 at least partially surrounding the interposer substrate pattern 311.

The interposer substrate pattern 311 may be electrically connected to the interposer connection terminals 320. The interposer insulation layer 312 may surround the interposer substrate pattern 311. The interposer insulation layer 312 may protect the interposer substrate pattern 311 from external impacts and may prevent an electrical short-circuit of the interposer substrate pattern 311.

The interposer connection terminals 320 may be formed below the interposer substrate 310 and may contact the conductive posts 210. The interposer connection terminals 320 may be electrically connected to the interposer substrate pattern 311. The interposer connection terminals 320 may include conductive balls and/or solder balls.

Figure 6:
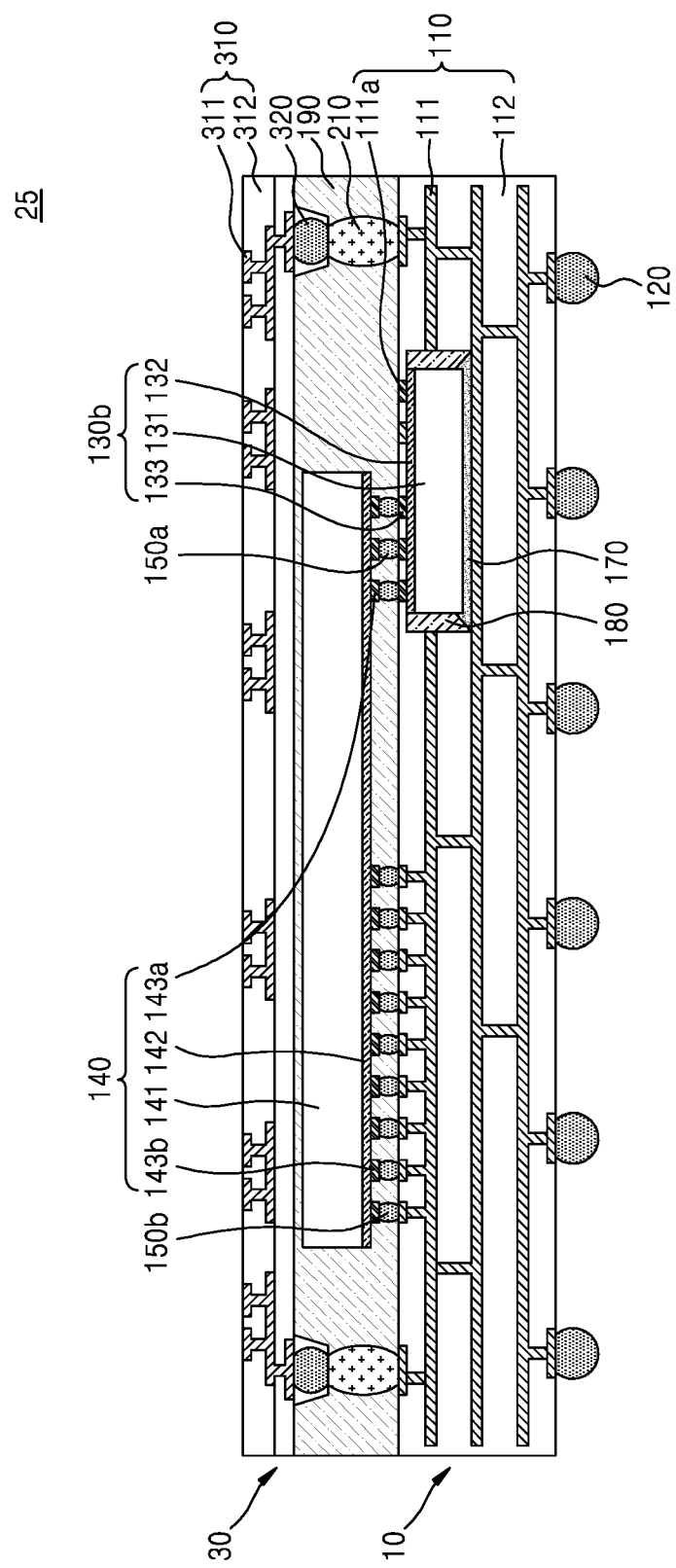

FIG. 6 is a cross-sectional view of a semiconductor package 25 according to an exemplary embodiment of the present inventive concept. The semiconductor package 25 of FIG. 6 may be a lower semiconductor package of a PoP-type semiconductor package. The PoP-type semiconductor package may include the lower semiconductor package and an upper semiconductor package.

The semiconductor package 25 of FIG. 6 may include the semiconductor package 20 of FIG. 2, and may further include conductive posts 210, a molding material 190, and an interposer 30. The conductive posts 210, the molding material 190, and the interposer 30 may be similar to the descriptions provided above with reference to FIG. 5, and thus a detailed description thereof will be omitted for brevity.

Figure 7:
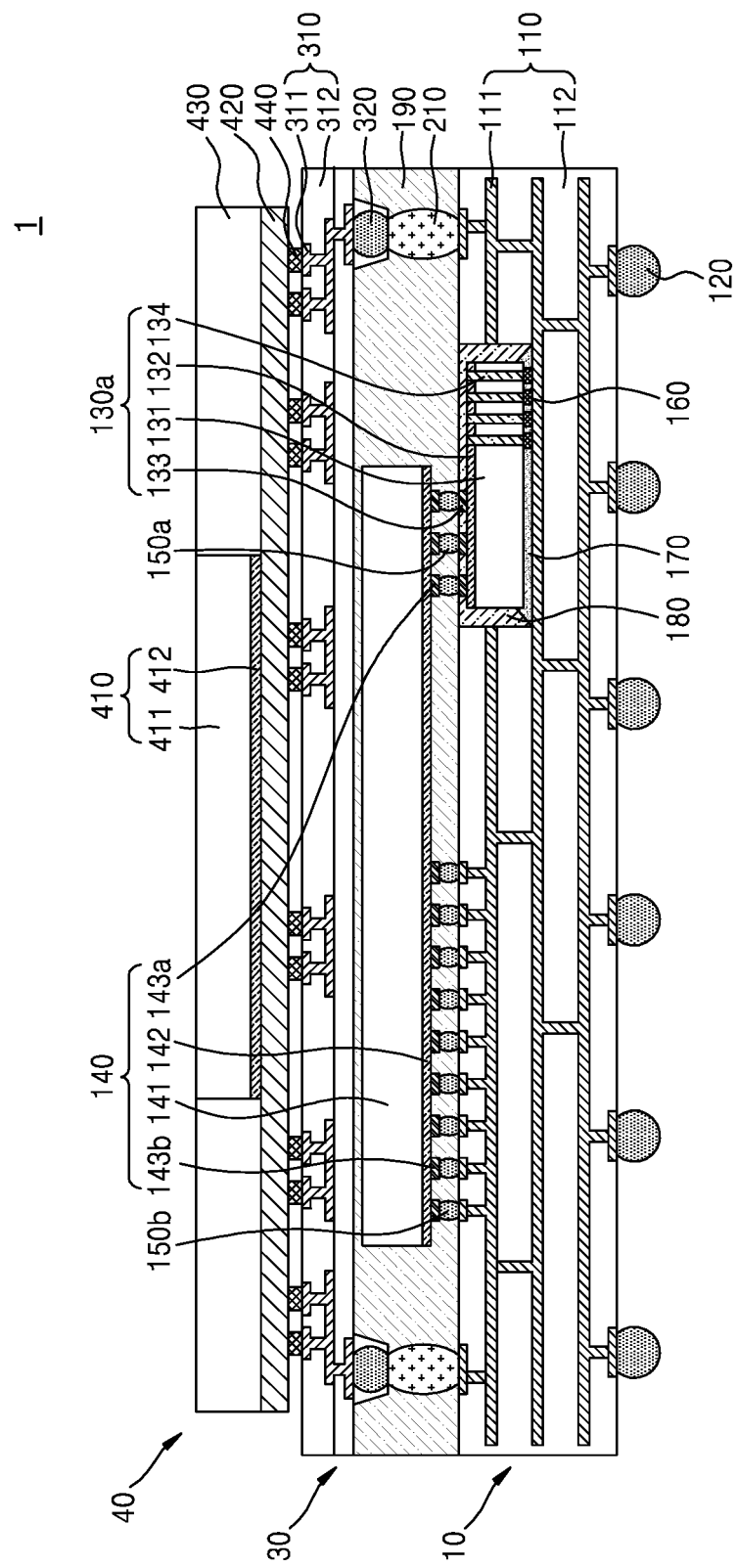
FIGS. 7 and 8 are PoP-type semiconductor packages according to exemplary embodiments of the present inventive concept.

FIG. 7 is a cross-sectional view of a semiconductor package 1 according to an exemplary embodiment of the present inventive concept. Referring to FIG. 7, the semiconductor package 1 may be a PoP-type semiconductor package including the lower semiconductor package 15 of FIG. 5 and an upper semiconductor package 40. The lower semiconductor package 15 may be similar to the description provided above with reference to FIG. 5.

According to an exemplary embodiment of the present inventive concept, the upper semiconductor package 40 may be mounted on the interposer 30. An upper semiconductor device 410 of the upper semiconductor package 40 may be connected to the package substrate 110 via the interposer 30.

The upper semiconductor package 40 may include the upper semiconductor device 410, an upper package substrate 420, an upper molding material 430, and upper connection terminals 440. The upper semiconductor device 410 may be a different type of semiconductor device from the first embedded semiconductor device 130a and the mounted semiconductor device 140. However, the present inventive concept is not limited thereto, and the upper semiconductor device 410 may be the same type of semiconductor device as one of the first embedded semiconductor device 130a and the mounted semiconductor device 140.

The upper semiconductor device 410 may include a third substrate 411 and a third active layer 412. According to an exemplary embodiment of the present inventive concept, the third substrate 411 may include a silicon wafer. The third active layer 412 may be formed on the third substrate 411 and may include a plurality of individual devices of various types. The upper semiconductor device 410 may be mounted on the upper package substrate 420 such that the third active layer 412 faces the upper package substrate 420.

The upper package substrate 420 may support the upper semiconductor device 410. The upper package substrate 420 may include an upper substrate pattern and an upper substrate insulation layer at least partially surrounding the upper substrate pattern. The upper package substrate 420 may include a PCB. However, the package substrate 110 is not limited to a PCB and may include various types of substrates, such as a ceramic substrate. The upper substrate pattern of the upper package substrate 420 may be electrically connected to the third active layer 412 of the upper semiconductor device 410.

The upper molding material 430 may be located on the upper package substrate 420 and may at least partially surround the upper semiconductor device 410. The upper molding material 430 may be configured to firmly fix the upper semiconductor device 410 onto the upper package substrate 420. The upper molding material 430 may include an insulative polymer and/or an epoxy resin. The upper molding material 430 may at least partially surround a lateral surface of the upper semiconductor device 410 and may expose an upper surface of the upper semiconductor device 410 to the outside. However, the present inventive concept is not limited thereto, and the upper molding material 430 may cover both the lateral surface and the upper surface of the upper semiconductor device 410 and may not expose the upper surface of the upper semiconductor device 410 to the outside.

The upper connection terminals 440 may be formed below the upper package substrate 420. For example, the upper connection terminals 440 may be interposed between the upper package substrate 420 and the interposer substrate 310. The upper connection terminals 440 may be electrically connected to the upper substrate pattern of the upper package substrate 420. The upper connection terminals 440 may electrically connect the upper substrate pattern of the upper package substrate 420 to the interposer substrate pattern 311 of the interposer substrate 310.

The upper semiconductor device 410 of the upper semiconductor package 40 may be connected to the package substrate 110 via the interposer 30 and the conductive posts 210.

Figure 8:
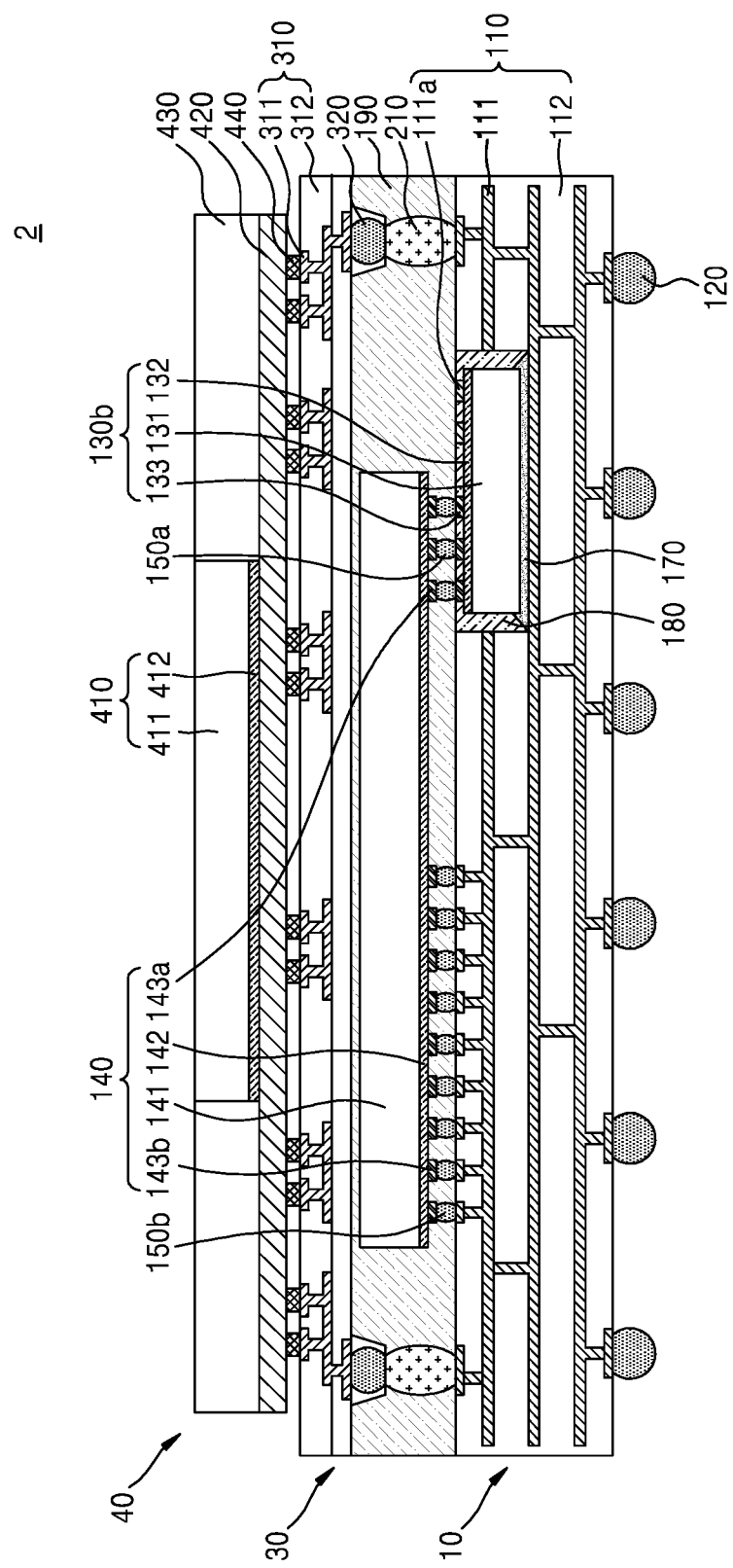

FIG. 8 is a cross-sectional view of a semiconductor package 2 according to an exemplary embodiment of the present inventive concept. Referring to FIG. 8, the semiconductor package 2 may be a PoP-type semiconductor package including the lower semiconductor package 25 of FIG. 6 and an upper semiconductor package 40. The lower semiconductor package 25 may be substantially the same as the description provided above with reference to FIG. 6.

According to an exemplary embodiment of the present inventive concept, the upper semiconductor package 40 may be mounted on the interposer 30. An upper semiconductor device 410 of the upper semiconductor package 40 may be connected to the package substrate 110 via the interposer 30. The upper semiconductor package 40 may include the upper semiconductor device 410, the upper package substrate 420, the upper molding material 430, and the upper connection terminals 440. The upper semiconductor package 40 may be similar to the description provided above with reference to FIG. 7, and thus a detailed description thereof will be omitted for brevity.

According to an exemplary embodiment of the present inventive concept, each connection terminal of the above described FIGS. 1 to 8 may be disposed in a groove.

A method of manufacturing a semiconductor package according to an exemplary embodiment of the present inventive concept will now be described with reference to FIGS. 9 through 17. For example, a method of manufacturing the PoP-type semiconductor package 1 of FIG. 7 will now be described with reference to FIGS. 9 through 17.

Figure 9:
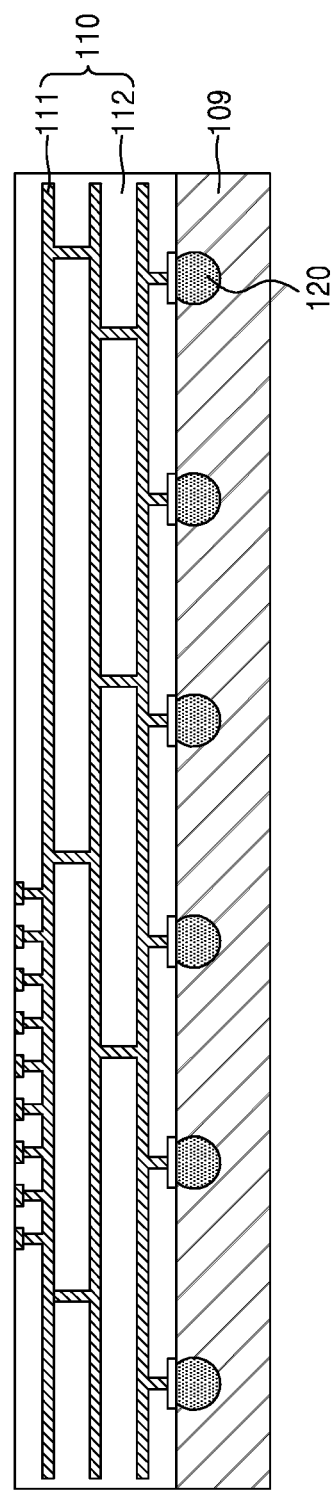
FIG. 9 illustrates an operation of attaching a protection substrate onto a package substrate according to an exemplary embodiment of the present inventive concept.

FIG. 9 illustrates an operation of attaching a protection substrate 109 onto the package substrate 110. Referring to FIG. 9, the method of manufacturing the semiconductor package according to an exemplary embodiment of the present inventive concept may include the operation of attaching the protection substrate 109 onto the package substrate 110. The protection substrate 109 may be attached onto one surface of the package substrate 110 on which the external connection terminals 120 are formed, and may at least partially surround the external connection terminals 120. In semiconductor package manufacturing operations to be described later, the protection substrate 109 may protect the external connection terminals 120 from external impacts.

Figure 10:
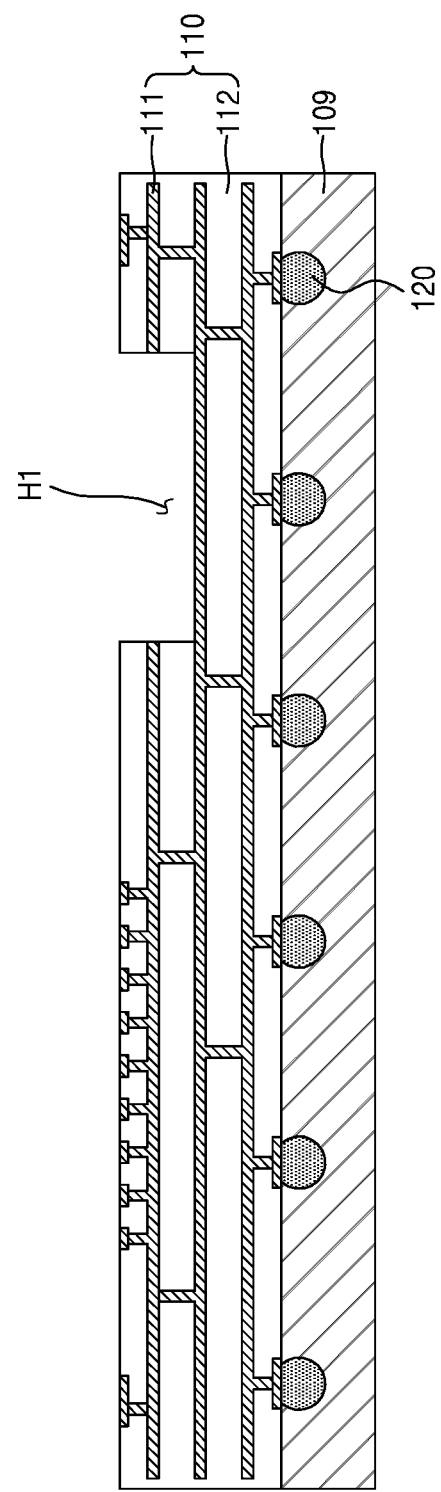
FIG. 10 illustrates an operation of forming a groove in the package substrate according to an exemplary embodiment of the present inventive concept.

FIG. 10 illustrates an operation of forming the groove H1 in the package substrate 110. Referring to FIG. 10, the method of manufacturing the semiconductor package according to an exemplary embodiment of the present inventive concept may include the operation of forming the groove H1 in the package substrate 110. The groove H1 may be formed in the package substrate 110 by, for example, etching or laser drilling. However, the present inventive concept is not limited thereto, and the groove H1 may be formed in the package substrate 110 by using various other methods.

According to an exemplary embodiment of the present inventive concept, the operation of forming the groove H in the package substrate 110 may include an operation of forming the groove H1 in the package substrate 110 such that the substrate pattern 111 is exposed to the outside. The groove H1 of the package substrate 110 may be formed to have a shape corresponding to that of the first embedded semiconductor device 130a. The groove H1 of the package substrate 110 may be formed to have a greater volume than the first embedded semiconductor device 130a.

Figure 11:
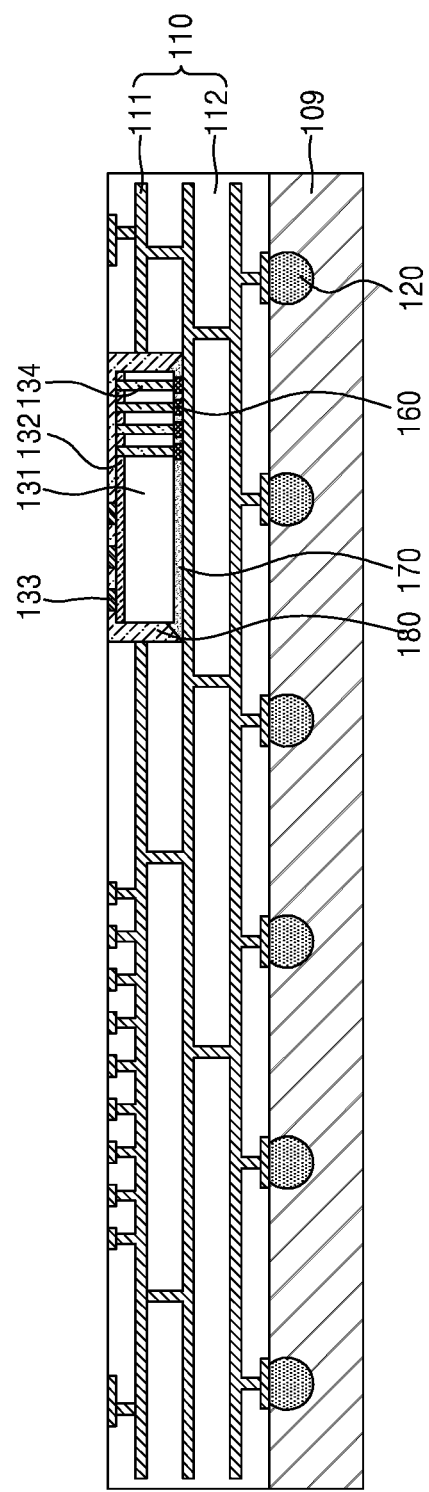
FIG. 11 illustrates an operation of inserting a first embedded semiconductor device into the groove of the package substrate according to an exemplary embodiment of the present inventive concept.

FIG. 11 illustrates an operation of inserting the first embedded semiconductor device 130a into the groove H1 of the package substrate 110. Referring to FIG. 11, the semiconductor package manufacturing method according to an exemplary embodiment of the present inventive concept may include an operation of inserting the first embedded semiconductor device 130a into the groove H1 of the package substrate 110, and an operation of electrically connecting the first embedded semiconductor device 130a to the package substrate 110.

According to an exemplary embodiment of the present inventive concept, the first embedded semiconductor device 130a may be inserted into the groove H1 such that the penetrating electrodes 134 are electrically connected to the substrate pattern 111 of the package substrate 110. For example, the internal connection terminals 160 formed below the penetrating electrodes 134 may be electrically connected to the substrate pattern 111 exposed by the groove H1. The internal connection terminals 160 may be interposed between the penetrating electrodes 134 and the substrate pattern 111, and thus may electrically connect the penetrating electrodes 134 to the substrate pattern 111.

According to an exemplary embodiment of the present inventive concept, the adhesion layer 170 may be formed between the package substrate 110 and the first embedded semiconductor device 130a. The adhesion layer 170 may be formed to at least partially surround the internal connection terminals 160. The adhesion layer 170 may firmly attach the first embedded semiconductor device 130a to the groove H1 of the package substrate 110.

According to an exemplary embodiment of the present inventive concept, the buried insulation layer 180 may be formed in a space between an inner wall of the package substrate 110 and a lateral surface of the first embedded semiconductor device 130a. The buried insulation layer 180 may at least partially surround the lateral surfaces of the first embedded semiconductor device 130a and may cover an upper surface thereof. However, the buried insulation layer 180 may expose the first chip pads 133 of the first embedded semiconductor device 130a to the outside by not covering the first chip pads 133.

Figure 12:
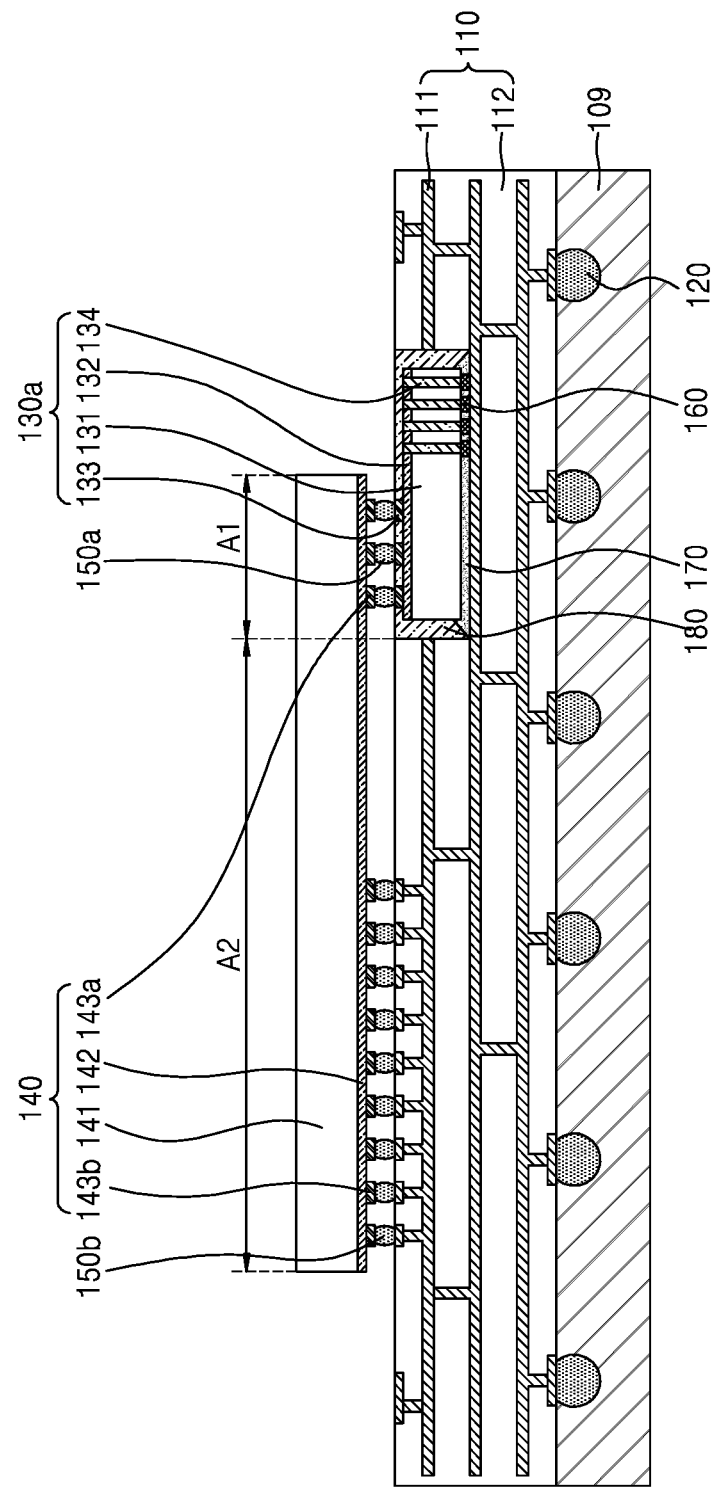
FIG. 12 illustrates an operation of mounting a mounted semiconductor device on the package substrate according to an exemplary embodiment of the present inventive concept.

FIG. 12 illustrates an operation of mounting the mounted semiconductor device 140 on the package substrate 110. The method of manufacturing the semiconductor package according to an exemplary embodiment of the present inventive concept may include the operation of mounting the mounted semiconductor device 140 on the package substrate 110.

As described above, the mounted semiconductor device 140 may include a first area A1 overlapping the groove H1 of the package substrate 110 in the vertical direction and the second area A2 not overlapping the groove H1 of the package substrate 110 in the vertical direction. The mounted semiconductor device 140 may include the second chip pads 143a in the first area A1, and may include the third chip pads 143b in the second area A2.

The first chip connection terminals 150a may be interposed between the first chip pads 133 and the second chip pads 143a, and may electrically connect the first chip pads 133 to the second chip pads 143a. The first chip connection terminals 150a may overlap the groove H of the package substrate 110 in the vertical direction. The mounted semiconductor device 140 may be connected to the first embedded semiconductor device 130a via the first chip connection terminals 150a.

The second chip connection terminals 150b may be interposed between the package substrate 110 and the third chip pads 143b, and may electrically connect the substrate pattern 111 of the package substrate 110 to the third chip pads 143b. The second chip connection terminals 150b might not overlap the groove H1 of the package substrate 110 in the vertical direction. The mounted semiconductor device 140 may be electrically connected to the package substrate 110 via the second chip connection terminals 150b.

Figure 13:
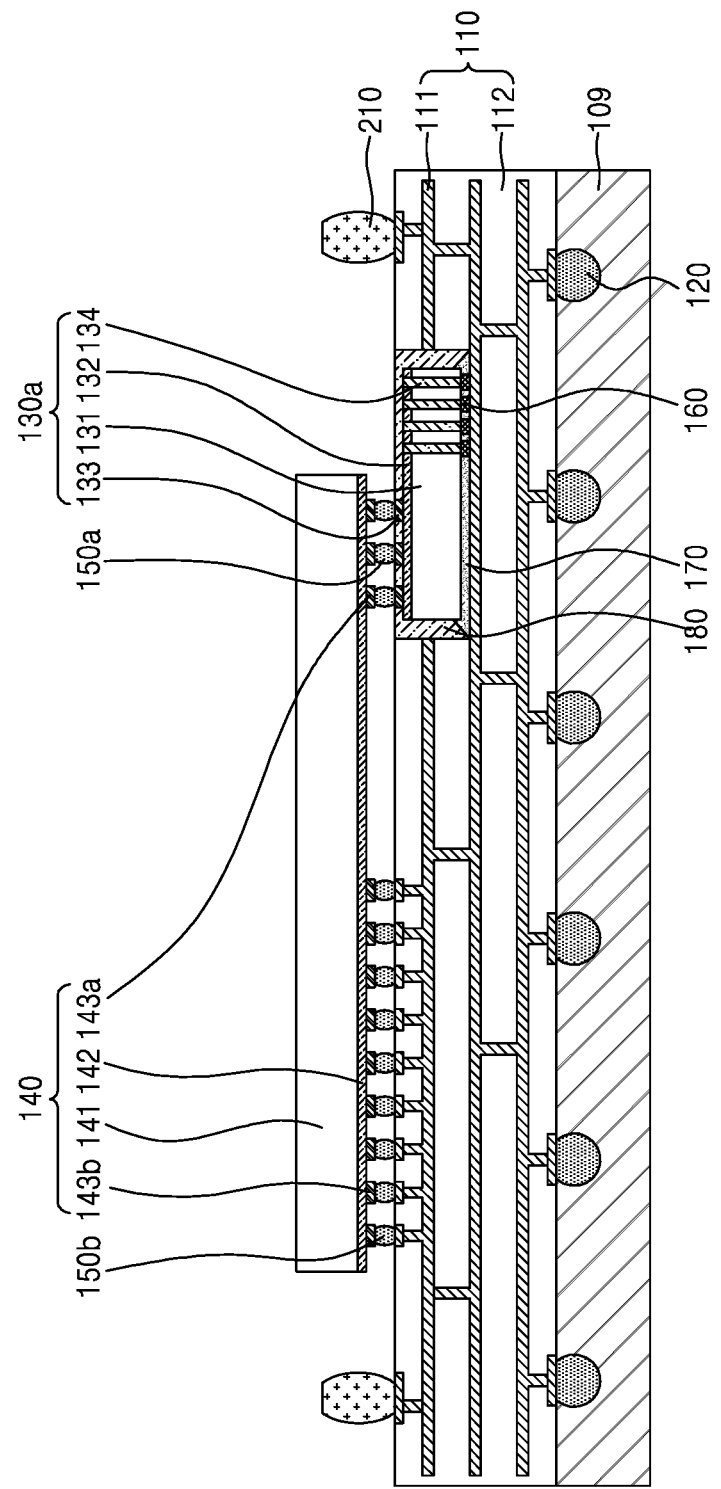
FIG. 13 illustrates an operation of forming conductive posts on the package substrate according to an exemplary embodiment of the present inventive concept.

FIG. 13 illustrates an operation of forming the conductive posts 210 on the package substrate 110. The method of manufacturing the semiconductor package according to an exemplary embodiment of the present inventive concept may include the operation of forming the conductive posts 210 on the package substrate 110.

The conductive posts 210 may be formed adjacent to lateral surfaces of the mounted semiconductor device 140. The conductive posts 210 may at least partially surround the mounted semiconductor device 140. A lower portion of the conductive posts 210 may contact the substrate pattern 111, and the conductive posts 210 may be electrically connected to the substrate pattern 111.

Figure 14:
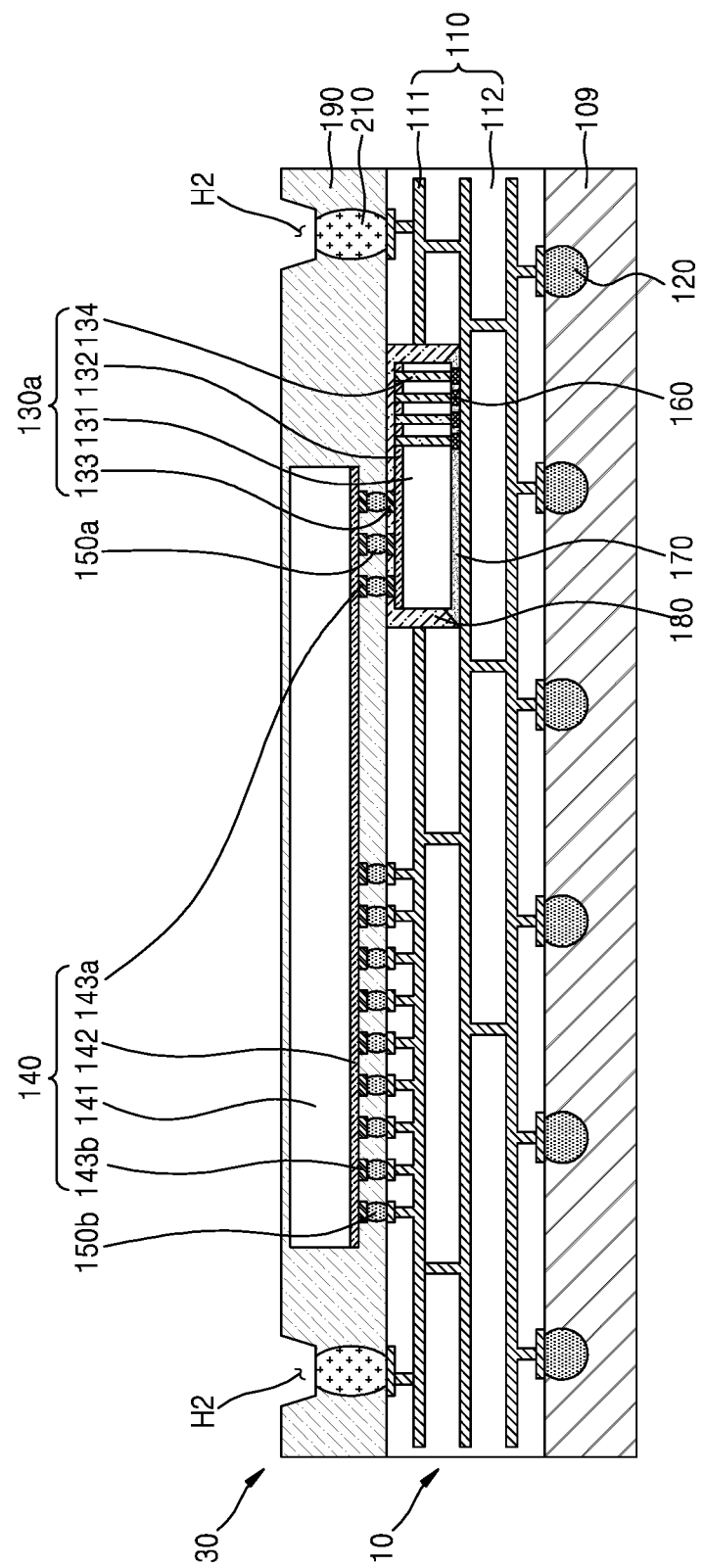
FIG. 14 illustrates an operation of forming a molding material on the package substrate according to an exemplary embodiment of the present inventive concept.

FIG. 14 illustrates an operation of forming the molding material 190 on the package substrate 110. The semiconductor package manufacturing method according to an exemplary embodiment of the present inventive concept may include an operation of forming the molding material 190 on the package substrate 110 and an operation of forming, in the molding material 190, grooves H2 partially exposing upper portions of the conductive posts 210.

According to an exemplary embodiment of the present inventive concept, the molding material 190 may be formed on the package substrate 110 to at least partially surround the mounted semiconductor device 140 and the conductive posts 210. The grooves H2 formed in the molding material 190 may partially expose the upper portions of the conductive posts 210 to the outside. The grooves H2 of the molding material 190 may be formed via, for example, etching or laser drilling. The conductive posts 210 exposed via the grooves H2 may be connected to the interposer connection terminals 320.

Figure 15:
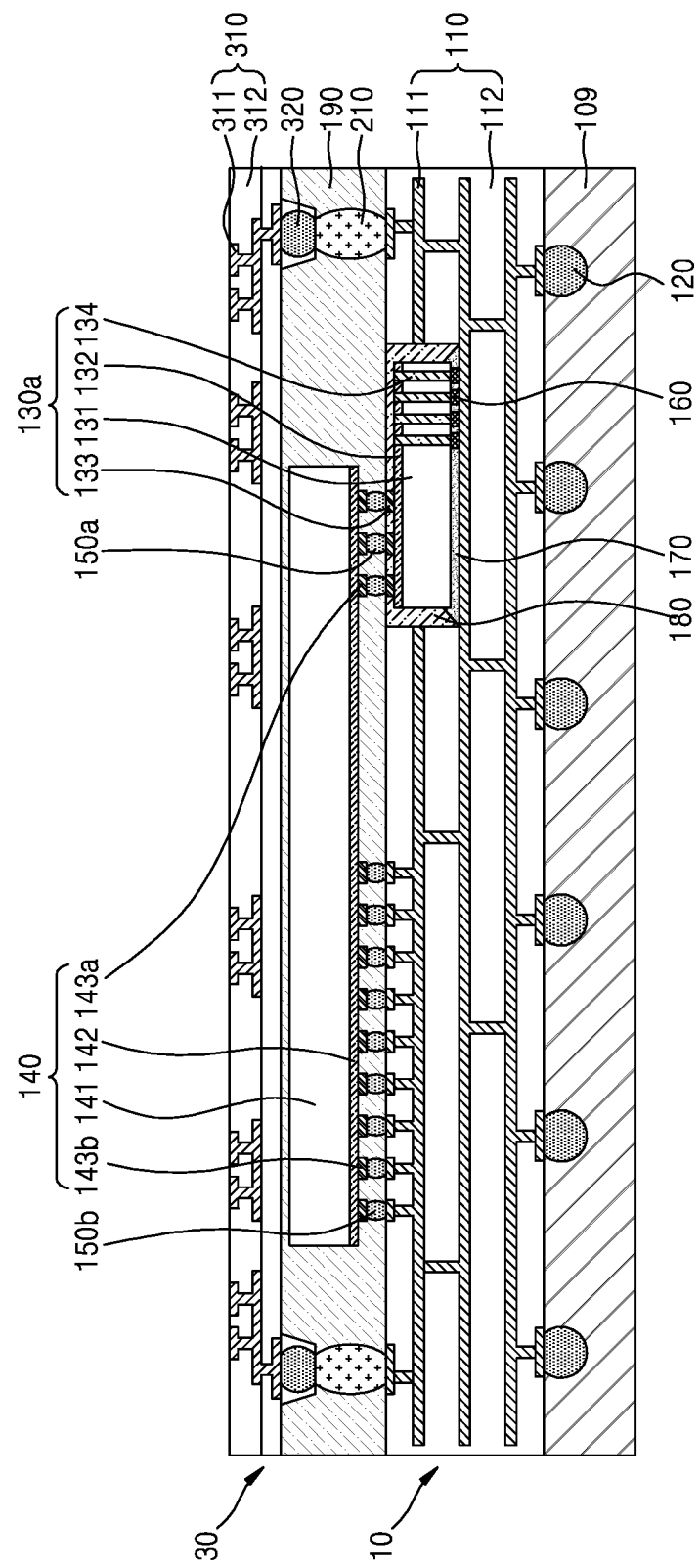
FIG. 15 illustrates an operation of mounting an interposer according to an exemplary embodiment of the present inventive concept.

FIG. 15 illustrates an operation of mounting the interposer 30. The method of manufacturing the semiconductor package according to an exemplary embodiment of the present inventive concept may include the operation of forming the interposer 30 on the molding material 190. The interposer 30 may be similar to the description provided above with reference to FIG. 5.

According to an exemplary embodiment of the present inventive concept, the operation of mounting the interposer 30 may include connecting the interposer connection terminals 320 to the conductive posts 210. For example, the interposer connection terminals 320 may be inserted into the grooves H2 formed in the molding material 190, and may contact the conductive posts 210. According to an exemplary embodiment of the present inventive concept, the interposer connection terminals 320 may be integrated with the conductive posts 210 by heat curing.

Figure 16:
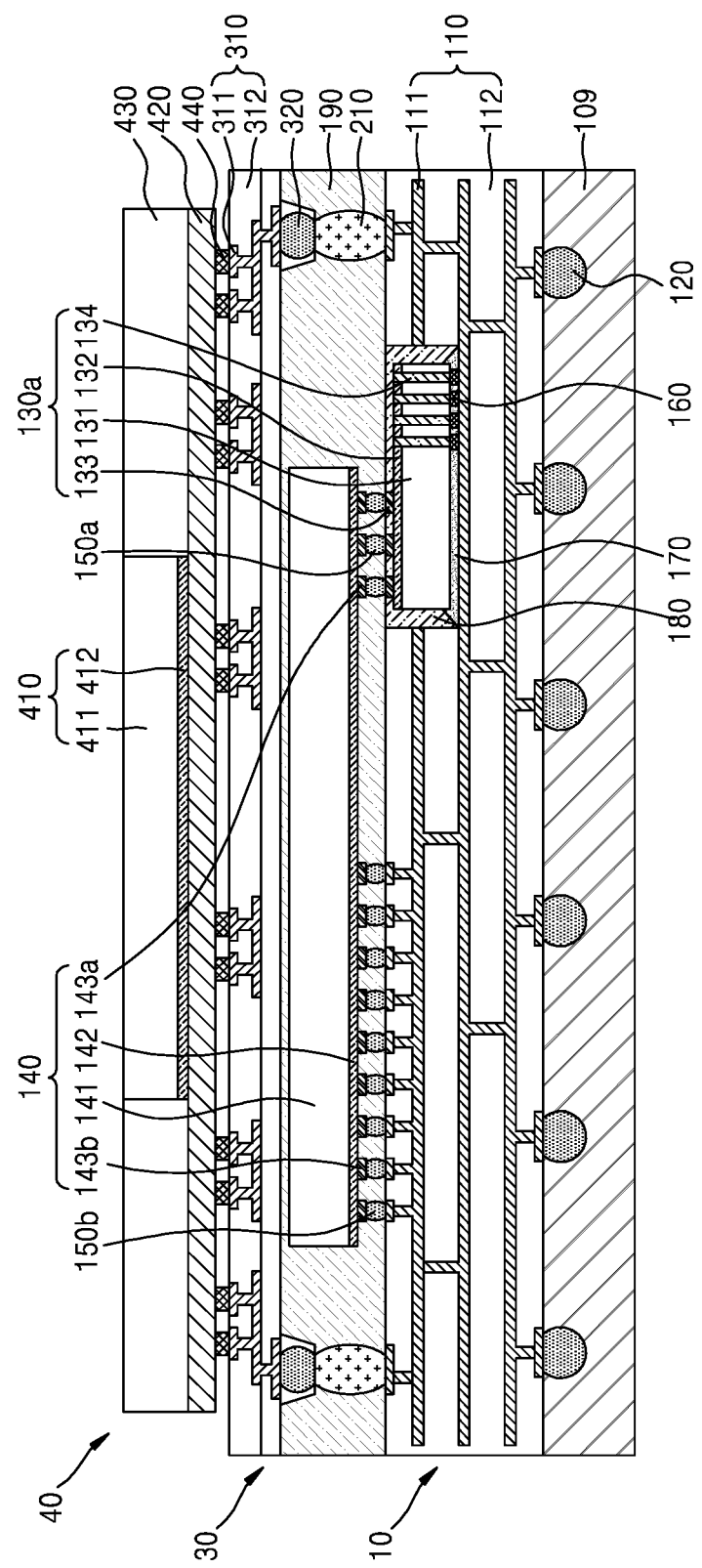
FIG. 16 illustrates an operation of mounting an upper semiconductor package on the interposer according to an exemplary embodiment of the present inventive concept.

FIG. 16 illustrates an operation of mounting the upper semiconductor package 40 on the interposer 30. The method of manufacturing the semiconductor package according to an exemplary embodiment of the present inventive concept may include the operation of mounting the upper semiconductor package 40 on the interposer 30. According to an exemplary embodiment of the present inventive concept, the operation of mounting the upper semiconductor package 40 on the interposer 30 may include electrically connecting the interposer 30 to the upper semiconductor package 40. The upper semiconductor package 40 may be similar to the description provided above with reference to FIG. 7.

For example, the upper connection terminals 440 of the upper semiconductor package 40 may be interposed between the upper package substrate 420 and the interposer substrate 310, and may be electrically connected to the upper substrate pattern of the upper package substrate 420.

Figure 17:
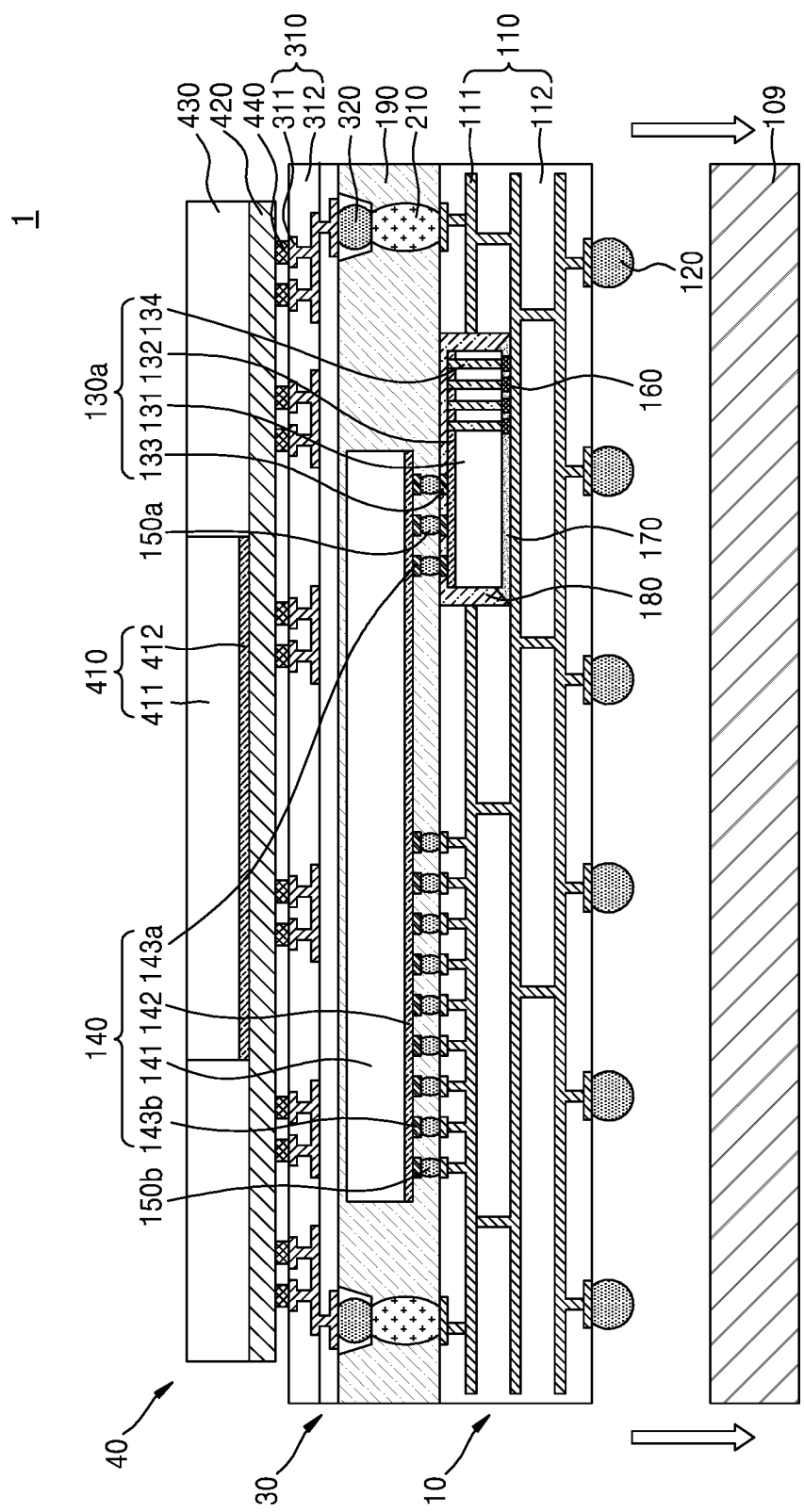
FIG. 17 illustrates an operation of separating a protection substrate from the package substrate according to an exemplary embodiment of the present inventive concept.

FIG. 17 illustrates an operation of separating the protection substrate 109 from the package substrate 110. Referring to FIG. 17, the method of manufacturing the semiconductor package according to an exemplary embodiment of the present inventive concept may include the operation of separating the protection substrate 109 from the package substrate 110. By separating the protection substrate 109 from the package substrate 110, the PoP-type semiconductor package 1 may be manufactured.

Because the first embedded semiconductor device 130*a* and the mounted semiconductor device 140 of the semiconductor package 1, manufactured by the semiconductor package manufacturing method according to an exemplary embodiment of the present inventive concept, may be electrically connected to each other and may have a short electrical connection path, the first embedded semiconductor device 130*a* and the mounted semiconductor device 140 may provide increased driving performance.

Because the semiconductor package 1 manufactured by the semiconductor package manufacturing method according to an exemplary embodiment of the present inventive concept may include the first embedded semiconductor device 130*a* inserted into the groove H1 of the package substrate 110, the semiconductor package 1 may be thin and light.

While exemplary embodiments of the present inventive concept have been particularly shown and described above, it will be understood that various changes in form and details may be made therein without departing from the spirit and scope of the present inventive concept.

What is claimed is:

1. A semiconductor package, comprising:
   a package substrate comprising a substrate pattern and a substrate insulation layer at east partially surrounding the substrate pattern, the package substrate having a groove;
   an external connection terminal disposed below the package substrate;
   an embedded semiconductor device disposed within the groove of the package substrate, the embedded semiconductor device comprising a first substrate;
   a first active layer disposed on the first substrate; and
   a first chip pad disposed on the first active layer;
   a buried insulation layer disposed within the groove of the package substrate and at least partially surrounding at least a portion of a lateral surface of the embedded semiconductor device; and
   a mounted semiconductor device disposed on the package substrate and connected to the package substrate and the embedded semiconductor device,
   wherein the groove exposes a portion of the substrate pattern of the package substrate, and the embedded semiconductor device further comprises a penetrating electrode that penetrates through the first substrate and is connected to the portion of the substrate pattern.

2. The semiconductor package of claim 1, wherein the mounted semiconductor device comprises:
   a second substrate;
   a second active layer disposed on the second substrate;
   a second chip pad disposed on the second active layer, the second chip connected to the first chip pad; and
   a third chip pad disposed on the second active layer, the third chip pad connected to the substrate pattern,
   wherein the second chip pad overlaps the groove in a vertical direction.

3. The semiconductor package of claim 2, wherein a width of a portion of the second substrate having the second chip pad overlapping the groove in the vertical direction is less than a width of a portion of the second substrate having the third chip pad not overlapping the groove in the vertical direction.

4. The semiconductor package of claim 2, further comprising:
   a first chip connection terminal interposed between the first chip pad and the second chip pad, the first chip connection terminal electrically connects the first chip pad to the second chip pad; and
   a second chip connection terminal interposed between the package substrate and the third chip pad,
   wherein the second chip connection terminal electrically connects the substrate pattern to the third chip pad, and
   wherein the embedded semiconductor device is disposed within the groove such that the first active layer faces the mounted semiconductor device.

5. The semiconductor package of claim 1, further comprising:
   a molding material disposed on the package substrate, the molding material at least partially surrounding the mounted semiconductor device; and
   a heat sink disposed on the molding material.

6. The semiconductor package of claim 1, further comprising:
   a conductive post disposed on the package substrate, the conductive post electrically connected to the substrate pattern; and
   a molding material disposed on the package substrate, the molding material at least partially surrounding the conductive post and the mounted semiconductor device,
   wherein the conductive post is formed around the owned semiconductor device, and
   wherein the molding material exposes a portion of the conductive post.

7. The semiconductor package of claim 6, further comprising an interposer disposed on the molding material, wherein the interposer comprises: an interposer substrate; and an interposer connection terminal formed below the interposer substrate and in contact with the conductive post.

8. A semiconductor package, comprising:
   a package substrate comprising a substrate pattern and a substrate insulation layer at east partially surrounding the substrate pattern, the package substrate having an internal space;
   an external connection terminal disposed below the package substrate;
   an embedded semiconductor device disposed within the internal space of the package substrate and at least partially surrounded by the package substrate, the embedded semiconductor device comprising a first substrate; a first active layer disposed on the first substrate; and a first chip pad disposed on the first active laver;

a buried insulation layer at least partially surrounding at least a portion of a lateral surface of the embedded semiconductor device; and a mounted semiconductor device disposed on the package substrate, the mounted semiconductor device connected to the package substrate and the embedded semiconductor device, wherein a portion of a lower surface of the mounted semiconductor device overlaps a portion of an upper surface of the embedded semiconductor device including the first active layer, in a vertical direction, and wherein the substrate insulation layer of the package substrate covers an upper surface of the embedded semiconductor device except for an upper surface of the first chip pad of the embedded semiconductor device.

9. The semiconductor package of claim 8, wherein a portion of the substrate pattern is disposed above the embedded semiconductor device and overlaps the internal space of the package substrate in a vertical direction, and the portion of the substrate pattern is spaced apart from the first chip pad.

10. The semiconductor package of claim 8, wherein the mounted semiconductor device comprises:

a second substrate;

a second active layer disposed on the second substrate;

a second chip pad disposed on the second active layer, the second chip connected to the first chip pad; and a third chip pad disposed on the second active layer, the third chip pad connected to the substrate pattern, wherein the second chip pad overlaps the internal space in a vertical direction, and wherein the third chip pad does not overlap the internal space in the vertical direction.

11. The semiconductor package of claim 10, wherein a first chip connection terminal is interposed between the first chip pad and the second chip pad, the first chip connection terminal electrically connecting the first chip pad to the second chip pad; and a second chip connection terminal is interposed between the package substrate and the third chip pad, the second chip connection terminal electrically connecting the substrate pattern to the third chip pad, wherein the embedded semiconductor device is disposed within the internal space such that the first active layer faces the mounted semiconductor device.

12. The semiconductor package of claim 8, further comprising:

a conductive post disposed on the package substrate, the conductive post electrically connected to the substrate pattern;

a molding material disposed on the package substrate, the molding material at least partially surrounding the conductive post and the mounted semiconductor device and exposing a portion of the conductive post; and an interposer disposed on the molding material, wherein the interposer comprises:

an interposer substrate; and an interposer connection terminal disposed below the interposer substrate and in contact with the conductive post.

13. A package-on-package (PoP) type semiconductor package, comprising:

a lower semiconductor package; and an upper semiconductor package disposed on the lower semiconductor package;

the lower semiconductor package comprising:

a package substrate comprising a substrate pattern and a substrate insulation layer at least partially surrounding the substrate pattern; the package substrate has a groove exposing a portion of the substrate pattern; an external connection terminal disposed below the package substrate; an embedded semiconductor device disposed within the groove of the package substrate, the embedded semiconductor device comprising a first substrate; a first active layer disposed on the first substrate; a first chip pad disposed on the first active layer; and a penetrating electrode penetrating the first substrate and connecting the first active layer to the substrate pattern exposed via the groove;

a mounted semiconductor device disposed on the package substrate and connected to the package substrate and the embedded semiconductor device;

a conductive post disposed on the package substrate and electrically connected to the substrate pattern;

a molding material disposed on the package substrate and at least partially surrounding the conductive post and the mounted semiconductor device and exposing a portion of the conductive post; and an interposer disposed on the molding material, the interposer comprising: an interposer substrate; and an interposer connection terminal disposed below the interposer substrate and in contact with the conductive post.

14. The semiconductor package of claim 13, wherein the mounted semiconductor device comprises:

a second substrate;

a second active layer disposed on the second substrate;

a second chip pad disposed on the second active layer and connected to the first chip pad; and a third chip pad disposed on the second active layer and connected to the substrate pattern, wherein the second chip pad overlaps the groove in a vertical direction, and wherein the third chip pad does not overlap the groove in the vertical direction.

15. The semiconductor package of claim 14, further comprising:

a first chip connection terminal interposed between the first chip pad and the second chip pad, the first chip connection terminal electrically connects the first chip pad to the second chip pad; and a second chip connection terminal interposed between the package substrate and the third chip pad, the second chip connection terminal electrically connects the substrate pattern to the third chip pad, wherein the embedded semiconductor device is disposed within the groove such that the first active layer faces the mounted semiconductor device.

16. The semiconductor package of claim 13, further comprising:

an internal connection terminal interposed between the penetrating electrode and a lower surface of the groove of the package substrate, the internal connection terminal configured to electrically connect the penetrating electrode to the substrate pattern;

an adhesion layer disposed on the embedded semiconductor device, the adhesion layer at least partially surrounding the internal connection terminal; and a buried insulation layer buried in the groove of the package substrate, the buried insulation layer at least partially surrounding at least a portion of a lateral surface of the embedded semiconductor device.

17. The semiconductor package of claim 16, wherein the buried insulation layer includes an epoxy resin, polybenzobisoxazole, benzocyclobutene, polymide, and/or a polymide derivative.

18. The semiconductor package of claim 16, wherein the buried insulation layer covers an upper surface of the embedded semiconductor device, and exposes the first chip pad of the embedded semiconductor device.

* * * * *